(12) United States Patent
Kwon et al.

(10) Patent No.: US 10,998,012 B2
(45) Date of Patent: May 4, 2021

(54) SEMICONDUCTOR MEMORY MODULES INCLUDING POWER MANAGEMENT INTEGRATED CIRCUITS

(71) Applicant: Samsung Electronics Co., Ltd., Suwon-si (KR)

(72) Inventors: Yoo-Jeong Kwon, Hwaseong-si (KR); Jinseong Yun, Suwon-si (KR); Kyudong Lee, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/727,066

(22) Filed: Dec. 26, 2019

(65) Prior Publication Data

US 2020/0335140 A1    Oct. 22, 2020

(30) Foreign Application Priority Data

Apr. 19, 2019 (KR) .......................... 10-2019-0045924
Jul. 2, 2019 (KR) .......................... 10-2019-0079496

(51) Int. Cl.
*G11C 5/14* (2006.01)
*G11C 5/04* (2006.01)

(52) U.S. Cl.
CPC .............. *G11C 5/147* (2013.01); *G11C 5/04* (2013.01)

(58) Field of Classification Search
None
See application file for complete search history.

(56) References Cited

U.S. PATENT DOCUMENTS

| | | |
|---|---|---|
| 7,679,345 B1 * | 3/2010 | Verma ..................... G05F 1/575 323/273 |
| 7,876,592 B2 | 1/2011 | Berke |
| 8,205,107 B2 | 6/2012 | Berke et al. |
| 8,374,049 B2 | 2/2013 | Liu et al. |
| 8,456,928 B2 | 6/2013 | Mutnury et al. |
| 8,495,330 B2 | 7/2013 | Vergis et al. |
| 9,214,199 B2 | 12/2015 | Brandl et al. |
| 9,330,734 B2 | 5/2016 | Mozak et al. |
| 9,910,484 B2 | 3/2018 | Muljono et al. |
| 10,141,963 B2 | 11/2018 | Yoo et al. |

* cited by examiner

*Primary Examiner* — James G Norman
(74) *Attorney, Agent, or Firm* — Myers Bigel, P.A.

(57) ABSTRACT

A semiconductor memory module includes a memory printed circuit board (PCB) that includes first connectors, a second connector, and a third connector configured to be connectable with an external device, memory devices that are mounted on the memory PCB and are connected with the first connectors, and a power management integrated circuit that is mounted on the memory PCB, receives a first voltage through the second connector, generates a second voltage from the first voltage, and supplies the second voltage to the memory devices. The power management integrated circuit adjusts the second voltage depending on a difference between a signal received through the third connector and the second voltage.

20 Claims, 14 Drawing Sheets

SEMICONDUCTOR MEMORY MODULES INCLUDING POWER MANAGEMENT INTEGRATED CIRCUITS

CROSS-REFERENCE TO RELATED APPLICATIONS

This application claims priority under 35 U.S.C. § 119 to Korean Patent Application No. 10-2019-0045924, filed on Apr. 19, 2019, in the Korean Intellectual Property Office, and to Korean Patent Application No. 10-2019-0079496, filed on Jul. 2, 2019, in the Korean Intellectual Property Office, the disclosures of each of which are incorporated by reference herein in their entireties.

TECHNICAL FIELD

Aspects of the present disclosure relate to semiconductor circuits, and more particularly, relate to semiconductor memory modules including power management integrated circuits.

BACKGROUND

Power management integrated circuits (PMIC) that reduce power consumption by adjusting levels of voltages are being developed responsive to an increasing demand for devices having lower power consumption. Many recent computing devices have been designed such that a power management integrated circuit is mounted thereon.

Dual-in memory modules (DIMM) are being used as main memory in computing devices. By mounting various volatile memories or nonvolatile memories on a DIMM, the DIMM may provide a storage space for a main memory to computing devices.

A dual data rate 5 (DDR5) synchronous dynamic random access memory (SDRAM) is being developed as an example product of a dynamic random access memory (DRAM). A DIMM for the DDR5 SDRAM is also being developed for the purpose of corresponding with a characteristic of the DDR5 SDRAM and supporting functions of the DDR5 SDRAM. The DIMM for the DDR5 SDRAM is being designed such that the power management integrated circuit is mounted thereon.

SUMMARY

Embodiments of the inventive concept provide semiconductor memory modules having lower power consumption and having improved reliability.

According to an exemplary embodiment, a semiconductor memory module includes a memory printed circuit board (PCB) that includes first connectors, a second connector, and a third connector configured to be connectable with an external device, memory devices that are mounted on the memory PCB and are connected with the first connectors, and a power management integrated circuit that is mounted on the memory PCB. The power management integrated circuit is configured to receive a first voltage through the second connector to generate a second voltage from the first voltage, and supply the second voltage to the memory devices. The power management integrated circuit is further configured to adjust the second voltage depending on a difference between a signal received through the third connector and the second voltage.

According to an exemplary embodiment, a semiconductor memory module includes a memory printed circuit board (PCB) that includes first connectors and a second connector configured to be connectable with an external device, memory devices that are mounted on the memory PCB and are connected with the first connectors, and a power management integrated circuit that is mounted on the memory PCB. The power management integrated circuit is configured to receive a first voltage through the second connector, generate a second voltage from the first voltage, and supply the second voltage to the memory devices. The power management integrated circuit may be configured to adjust the second voltage depending on an amount of current flowing at an idle time.

According to an exemplary embodiment, a semiconductor memory module includes a memory printed circuit board (PCB) that includes first connectors, a second connector, and a third connector configured to be connectable with an external device, memory devices that are mounted on the memory PCB and are connected with the first connectors, and a power management integrated circuit that is mounted on the memory PCB. The power management integrated circuit is configured to receive a first voltage through the second connector, generate a second voltage from the first voltage, and supply the second voltage to the memory devices. In a first mode, the power management integrated circuit is configured to adjust the second voltage depending on a difference between a signal received through the third connector and the second voltage. In a second mode, the power management integrated circuit is configured to adjust the second voltage depending on an amount of current flowing at an idle time.

BRIEF DESCRIPTION OF THE FIGURES

The above and other objects and features of the inventive concepts will become apparent by describing in detail exemplary embodiments thereof with reference to the accompanying drawings.

DETAILED DESCRIPTION

Below, aspects of the present disclosure may be described in detail and clearly to such an extent that an ordinary one in the art may readily implement the inventive concepts.

Figure 1:
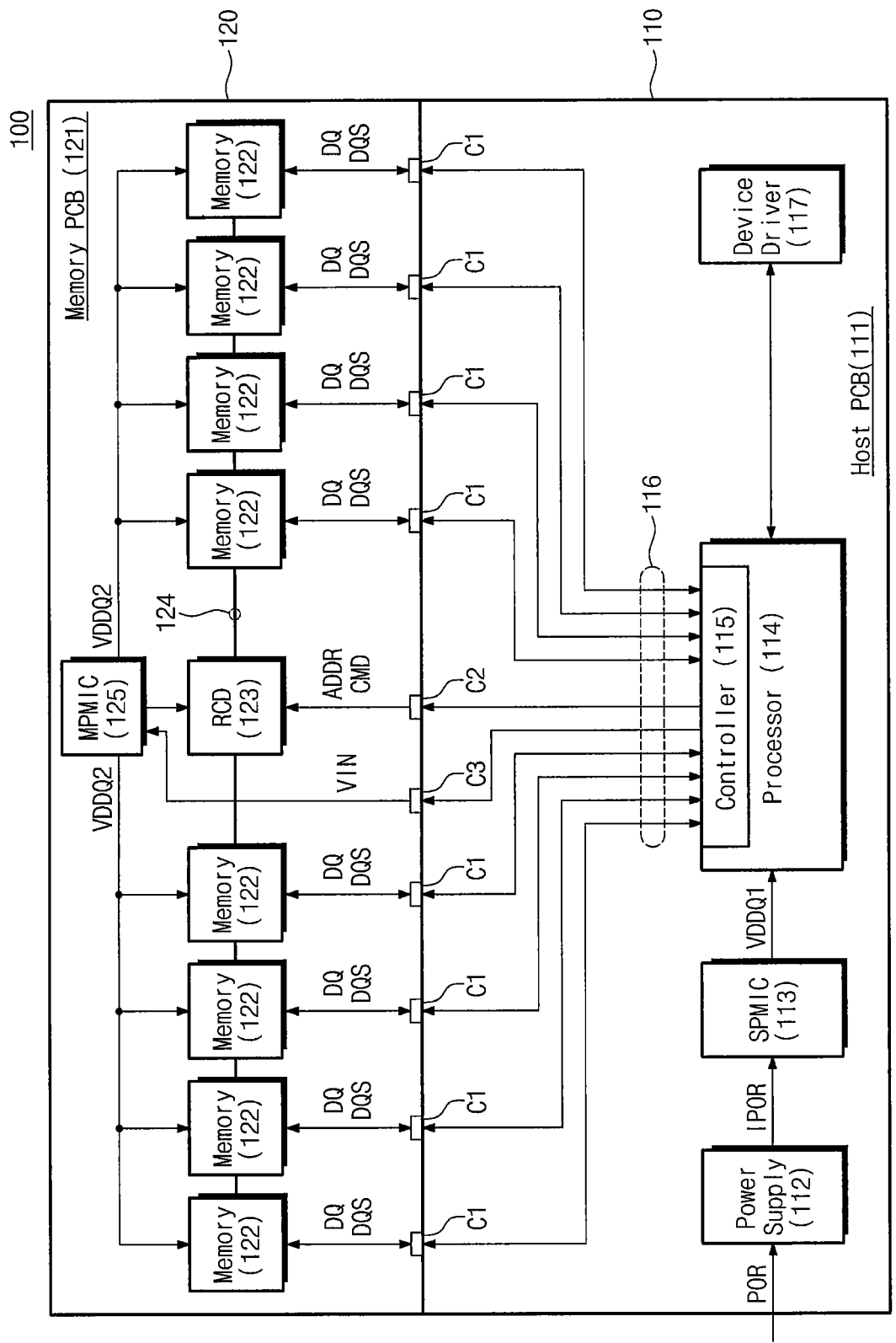
FIG. 1 illustrates a computing system according to some embodiments of the inventive concepts.

FIG. 1 illustrates a computing system 100 according to some embodiments of the inventive concepts. Referring to FIG. 1, the computing system 100 may include a host device 110 and a semiconductor memory module 120. The host device 110 may include, for example, various computing devices such as a computer, a notebook computer, a workstation, an application server, a data server, a smartphone, a smart pad, a smart tablet, and a smart watch.

The host device 110 may include a host printed circuit board (PCB) 111, a power supply 112, a system power management integrated circuit (SPMIC) 113, a processor 114, and a device driver 117.

The power supply 112, the SPMIC 113, the processor 114, the device driver 117, the semiconductor memory module 120, or connection devices configured to be connected to them may be mounted on the host PCB 111.

The host PCB 111 may include a plate implemented with an insulator such as plastic, and wires electrically connecting the connection devices configured to be connectable to the power supply 112, the SPMIC 113, the processor 114, the device driver 117, the semiconductor memory module 120.

The power supply 112 may receive a power POR from outside of the system illustrated in FIG. 1, and may output an internal power IPOR based on the power POR. The SPMIC 113 may receive the internal power IPOR and may generate a host voltage VDDQ1 from the internal power IPOR. The host voltage VDDQ1 may be supplied to the processor 114.

The processor 114 may include a central processing unit (CPU) or an application processor (AP) that executes an operating system or applications of the host device 110. The processor 114 may include a graphic processing unit (GPU) or a neural processing unit (NPU) that processes particular tasks in response to a request of the CPU or AP.

The processor 114 may include a controller 115. The processor 114 may access the semiconductor memory module 120 through the controller 115. The processor 114 may access peripheral devices through the device driver 117. For example, the peripheral devices may include a storage device, a user interface for exchanging information with a user, and so on.

The processor 114 may include the controller 115. The controller 115 may be connected through wires 116 on the host PCB 111 to first connectors C1, second connectors C2, or third connectors C3 of the semiconductor memory module 120 or connection devices configured such that the connectors C1 to C3 are connected thereto. The controller 115 may exchange signals with the semiconductor memory module 120 through the wires 116.

In an embodiment, the controller 115 may be configured to exchange signals with the semiconductor memory module 120 by using the host voltage VDDQ1 received from the SPMIC 113 as a voltage of a high level and using a ground voltage as a voltage of a low level.

The semiconductor memory module 120 may include a memory PCB 121, memory devices 122, a register clock driver (RCD) 123, and a memory power management integrated circuit (MPMIC) 125.

The memory devices 122, the RCD 123, the MPMIC 125, or connection devices configured to be connected therewith may be mounted on the memory PCB 121. The memory PCB 121 may include the first connectors C1, the second connectors C2, and the third connectors C3 configured to be connectable (or attachable) to the host device 110.

The memory PCB 121 may include a plate implemented with an insulator such as plastic, connection devices configured to be connectable to the memory devices 122, the RCD 123, the MPMIC 125, and wires electrically connecting the first connectors C1, the second connectors C2, and the third connectors C3.

The memory devices 122 may be connected to the first connectors C1 through wires on the memory PCB 121. The first connectors C1 may include gold fingers of a dual in-line memory module (DIMM). The memory devices 122 may exchange data DQ and a data strobe signal DQS with an external device through the first connectors C1.

The memory devices 122 may include various memories such as a dynamic random access memory (DRAM), a phase-change RAM (PRAM), a ferroelectric RAM (FRAM), a magnetic RAM (MRAM), a resistive RAM (RRAM), and a flash memory, as examples.

The RCD 123 may be mounted on the memory PCB 121. The RCD 123 may be connected to the second connectors C2 through wires on the memory PCB 121. The second connectors C2 may include gold fingers of the DIMM. The RCD 123 may receive an address ADDR and a command CMD from the host device 110 through the second connectors C2.

The RCD 123 may further receive various signals (e.g., including a clock signal and control signals) from the host device 110 through the second connectors C2. The RCD 123 may transmit the address ADDR, the command CMD, and various signals to the memory devices 122 through first wires 124 on the memory PCB 121.

The MPMIC 125 may be mounted on the memory PCB 121. The MPMIC 125 may be connected to the third connectors C3 through wires on the memory PCB 121. The third connectors C3 may include gold fingers of the DIMM.

The MPMIC 125 may receive input voltages VIN through the third connectors C3. The MPMIC 125 may generate various voltages including a memory voltage VDDQ2 from the input voltages VIN. The MPMIC 125 may supply various voltages including the memory voltage VDDQ2 to the memory devices 122 and the RCD 123.

For example, the input voltages VIN may include a bulk input voltage VIN_Bulk and a management input voltage VIN_mgmt. The bulk input voltage VIN_Bulk may have a normal level of 12 V (Volts) and an allowable range of 10 V to 13.8 V in a normal operating mode and may have a normal level of 5 V and an allowable range of 4.25 V to 13.8 V in a low-power mode and a catastrophic mode, and the management input voltage VIN_mgmt may have a normal level of 3.3 V and an allowable range of 3.0 V to 3.6 V.

The MPMIC 125 may interact with capacitors and inductors mounted on the memory PCB 121 to generate and output various voltages including the memory voltage VDDQ2. For example, the MPMIC 125 may output a voltage of 1.1 V as the memory voltage VDDQ2. Also, the MPMIC 125 may generate and output various voltages such as a power supply voltage VDD of 1.0 V, a high voltage VPP of 1.8 V, a 1.1V output voltage VOUT_1.1V, and a 1.8V output voltage VOUT_1.8V.

The memory devices 122 and the RCD 123 may exchange signals with an external device by using the memory voltage VDDQ2 as a high level and the ground voltage as a low level. For example, the memory devices 122 may exchange the data DQ and the data strobe signal DQS with the controller 115 through the first connectors C1, based on the memory voltage VDDQ2.

The RCD 123 may receive the address ADDR and the command CMD through the second connectors C2 based on the memory voltage VDDQ2 and may exchange various signals with the controller 115.

The semiconductor memory module 120 described with reference to FIG. 1 may be organized based on a registered DIMM (RDIMM). As described with reference to FIG. 1, the semiconductor memory module 120 may be configured to include the independent MPMIC 125 separated from the SPMIC 113. In particular, in conjunction with the development of the DIMM corresponding with the DDR5 SDRAM, the present disclosure provides a configuration in which the MPMIC 125 is disposed on the semiconductor memory module 120.

In the computing system 100 of FIG. 1, the controller 115 uses the host voltage VDDQ1 as a high level when exchanging signals through the first connectors C1 or the second connectors C2. The memory devices 122 or the RCD 123 uses the memory voltage VDDQ2 as a high level when exchanging signals through the first connectors C1 or the second connectors C2.

In the case where there is a difference between the host voltage VDDQ1 and the memory voltage VDDQ2, an unintended direct-current (DC) current may flow between the memory devices 122 and the controller 115 or between the RCD 123 and the controller 115. For example, the memory devices 122 may drive the first connectors C1 with a high level, and the controller 115 may drive the first connectors C1 with a high level.

In this case, when the memory voltage VDDQ2 is lower than the host voltage VDDQ1, a DC current may flow from the controller 115 to the memory devices 122. In contrast, when the memory voltage VDDQ2 is higher than the host voltage VDDQ1, a DC current may flow from the memory devices 122 to the controller 115. The same phenomenon may occur between the RCD 123 and the controller 115.

The unintended DC current may cause power consumption. Also, the unintended DC current may act as a stress on the semiconductor memory module 120 or the controller 115, thus causing a decrease in reliability of the semiconductor memory module 120 or the controller 115.

To solve the above issue, a semiconductor memory module according to some embodiments of the inventive concepts may be configured to detect a difference between the host voltage VDDQ1 and the memory voltage VDDQ2 and to adjust the memory voltage VDDQ2 such that the voltage difference decreases.

Figure 2:
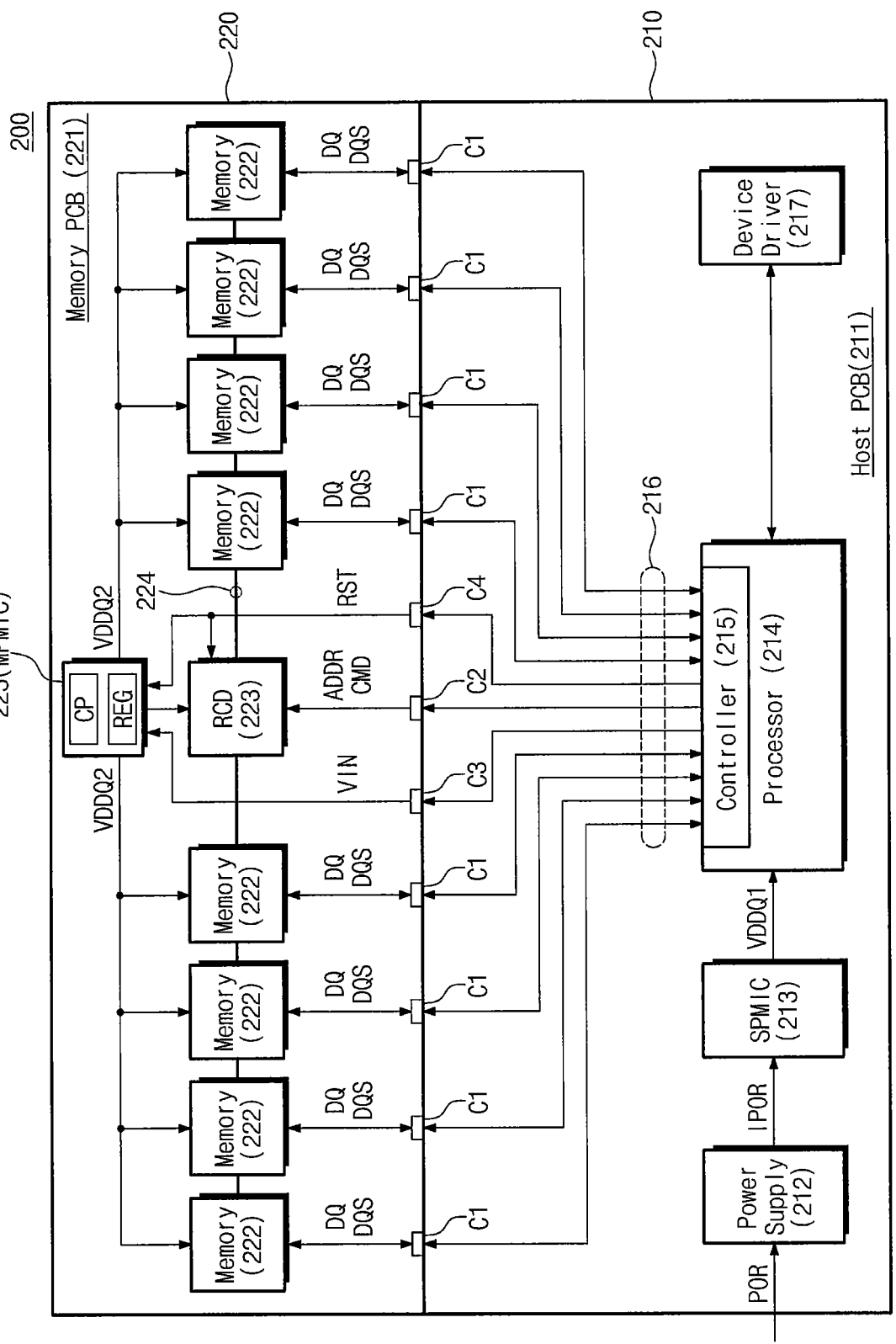
FIG. 2 illustrates a computing system according to some embodiments of the inventive concepts.

FIG. 2 illustrates a computing system 200 according to some embodiments of the inventive concepts. Referring to FIG. 2, the computing system 200 may include a host device 210 and a semiconductor memory module 220. The host device 210 may include a host PCB 211, a power supply 212, an SPMIC 213, a processor 214, and a device driver 217, each of which may be similar to their corresponding component shown in FIG. 1.

The processor 214 may include a controller 215. The controller 215 may be connected to the semiconductor memory module 220 through wires 216. In addition to being connected to first through third connectors C1 to C3 of the semiconductor memory module 220, the controller 215 may be connected to a fourth connector C4 through some corresponding wires of the wires 216. The controller 215 may transmit a reset signal RST to the semiconductor memory module 220 through the fourth connector C4.

The reset signal RST may be an active low signal that is in an inactive state at a high level and is in an active state at a low level. The controller 215 is configured to use the host voltage VDDQ1 as a high level. Accordingly, the reset signal RST may be at a high level in the inactive state and may be of the host voltage VDDQ1.

Except for further transmitting the reset signal RST to the fourth connector C4, the host device 210 may be configured and operate the same or similarly as the host device 110 described with reference to FIG. 1. Thus, additional description will be omitted to avoid redundancy. Unless the description given in the host device 110 of FIG. 1 explicitly differs from that of the host device 210 of FIG. 2, the configurations, operations, and characteristics described with regard to the host device 110 of FIG. 1 may be applied to the host device 210 of FIG. 2 without modification.

The semiconductor memory module 220 may include a memory PCB 221, memory devices 222, an RCD 223, and an MPMIC 225. The memory PCB 221 may include the first connectors Cl, the second connectors C2, the third connectors C3, and the fourth connector C4.

A configuration and an operation of the semiconductor memory module 220 may be similar to those of the semiconductor memory module 120 described with reference to FIG. 1. Thus, additional description will be omitted to avoid redundancy. Unless the description given in the semiconductor memory module 120 of FIG. 1 explicitly differs from that of the semiconductor memory module 220 of FIG. 2, the configurations, operations, and characteristics described with regard to the semiconductor memory module 120 of FIG. 1 may be applied to the semiconductor memory module 220 of FIG. 2 without modification.

Compared with the memory PCB 121 of FIG. 1, the memory PCB 221 may further include a wire connecting the fourth connector C4 with the RCD 223 and the MPMIC 225. The reset signal RST received through the fourth connector C4 may be transferred to the RCD 223 and the MPMIC 225.

The reset signal RST is separately illustrated to describe the technical idea of the inventive concepts more clearly, but in some embodiments the reset signal RST may be included in various signals received through the second connectors C2 described with reference to FIG. 1. The RCD 223 may transfer the reset signal RST to the memory devices 222 through first wires 224.

The memory devices 222 and the RCD 223 may perform an initialization operation in response to activation and/or deactivation of the reset signal RST (e.g., when the reset signal RST is activated and then deactivates). For example, the memory devices 222 and the RCD 223 may perform the initialization operation, which includes mode register setting, write leveling, ZQ calibration, and DQ training, with the controller 215.

The MPMIC 225 may include a register REG and a comparator CP. The register REG may store information about a level of the memory voltage VDDQ2 that the MPMIC 225 generates. The MPMIC 225 may generate the memory voltage VDDQ2 based on the information stored in the register REG.

For example, the register REG may be a nonvolatile memory device that stores level information of the memory voltage VDDQ2. For another example, the level information of the memory voltage VDDQ2 may be stored in a separate nonvolatile memory (not illustrated) in the MPMIC 225 and may be loaded onto the register REG from the separate nonvolatile memory after the input voltages VIN are supplied to the MPMIC 225.

For example, the register REG may store information about a default level of the memory voltage VDDQ2, that is, information about the same level as the host voltage VDDQ1. The MPMIC 225 may generate the memory voltage VDDQ2 based on the information about the default level stored in the register REG.

However, due to process, voltage and temperature (PVT) variations, the memory voltage VDDQ2 that the MPMIC 225 actually generates may differ from the host voltage VDDQ1. The MPMIC 225 may adjust the memory voltage VDDQ2 such that the memory voltage VDDQ2 is the same as the host voltage VDDQ1 or is as similar as possible to the host voltage VDDQ1 within resolution limits.

The comparator CP of the MPMIC 225 may receive the reset signal RST. As described above, the reset signal RST may be of the host voltage VDDQ1 in the inactive state. The comparator CP may compare the reset signal RST of the inactive state and the memory voltage VDDQ2 to detect a difference between the host voltage VDDQ1 and the memory voltage VDDQ2.

Depending on the detected voltage difference, the MPMIC 225 may update the level information of the memory voltage VDDQ2 stored in the register REG. For example, the MPMIC 225 may update the level information of the register REG when the detected difference is greater than a threshold. The threshold may be determined depending on a minimum unit (e.g., a resolution) in which the MPMIC 225 is able to adjust the memory voltage VDDQ2. As the level information is updated, the MPMIC 225 may adjust a level of the memory voltage VDDQ2.

For example, when the memory voltage VDDQ2 is lower in level than the host voltage VDDQ1, the MPMIC 225 may update the level information of the register REG such that the memory voltage VDDQ2 increases. When the memory voltage VDDQ2 is higher in level than the host voltage VDDQ1, the MPMIC 225 may update the level information of the register REG such that the memory voltage VDDQ2 decreases.

Herein, an operation in which the MPMIC 225 compares the memory voltage VDDQ2 with the reset signal RST of the inactive state and adjusts as needed the memory voltage VDDQ2 based on a result of the comparison may be referred to as a "calibration operation".

In an embodiment, the MPMIC 225 may update the level information of the register REG such that the memory voltage VDDQ2 is adjusted as much as a level corresponding to the detected voltage difference. For another example, the MPMIC 225 may update the level information of the register REG such that the memory voltage VDDQ2 is adjusted in a particular unit (e.g., a calibration unit).

The MPMIC 225 may update the level information of the register REG such that the memory voltage VDDQ2 is adjusted in a first unit (e.g., coarse calibration) and may then update the level information of the register REG such that the memory voltage VDDQ2 is adjusted in a second unit smaller than the first unit (e.g., fine calibration).

The MPMIC 225 may perform the calibration operation on the memory voltage VDDQ2 at various times. For example, the MPMIC 225 may consistently compare the memory voltage VDDQ2 with the reset signal RST of the inactive state. The MPMIC 225 may be configured to perform the calibration operation on the memory voltage VDDQ2 in response to detecting that the memory voltage VDDQ2 is different from the reset signal RST of the inactive state.

For another example, the MPMIC 225 may perform the calibration operation on the memory voltage VDDQ2 after the reset signal RST is activated and is deactivated. For example, after the reset signal RST is activated and is deactivated, the memory devices 222 and the RCD 223 may not communicate with the controller 215 during a given time (e.g., 500 microseconds (μs)). During the given time, the MPMIC 225 may perform the calibration operation on the memory voltage VDDQ2.

The MPMIC 225 may perform the calibration operation on the memory voltage VDDQ2 under control of the RCD 223. The RCD 223 may allow the MPMIC 225 to perform the calibration operation on the memory voltage VDDQ2 at a time when it is predicted that there is no communication with the controller 215 for a while. For example, as entering a self-refresh operation, the RCD 223 may allow the MPMIC 225 to perform the calibration operation on the memory voltage VDDQ2.

For example, the calibration operation that the MPMIC 225 performs on the memory voltage VDDQ2 may be activated and deactivated by the controller 215. The controller 215 may activate or deactivate the calibration operation of the MPMIC 225 in an initialization operation or at a necessary timing.

For example, the RCD 223 may allow the MPMIC 225 to perform the calibration operation depending on a request of the controller 215. When a particular control signal of control signals received through the second connectors C2 is activated, the RCD 223 may allow the MPMIC 225 to perform the calibration operation.

The description as given in FIG. 2 is the MPMIC 225 receives the reset signal RST and performs the calibration operation by comparing the memory voltage VDDQ2 with the reset signal RST of the inactive state. However, the MPMIC 225 may be modified or changed to perform the calibration operation based on a result of comparing the memory voltage VDDQ2 with any other signal having a characteristic of a high level dominantly, instead of the reset signal RST. For example, the MPMIC 225 may be modified or changed to perform the calibration operation by comparing the memory voltage VDDQ2 with signals such as a store signal (e.g., Save) or an alert signal.

The description as given in FIG. 2 is the MPMIC 225 directly receives the reset signal RST through the fourth connector C4. However, the RCD 223 may be modified or changed to output the reset signal RST received through the fourth connector C4 to the MPMIC 225. Also, the MPMIC 225 may be modified or changed to compare the memory voltage VDDQ2 with the reset signal RST received from the RCD 223.

The description as given in FIG. 2 is the MPMIC 225 adjusts the memory voltage VDDQ2. However, the MPMIC 225 may be configured to adjust various voltages such as the power supply voltage VDD, the high voltage VPP, the 1.1V output voltage VOUT_1.1V, and the 1.8V output voltage VOUT_1.8V, as well as the memory voltage VDDQ2.

The semiconductor memory module 220 described with reference to FIG. 2 may be organized based on an RDIMM.

Figure 3:
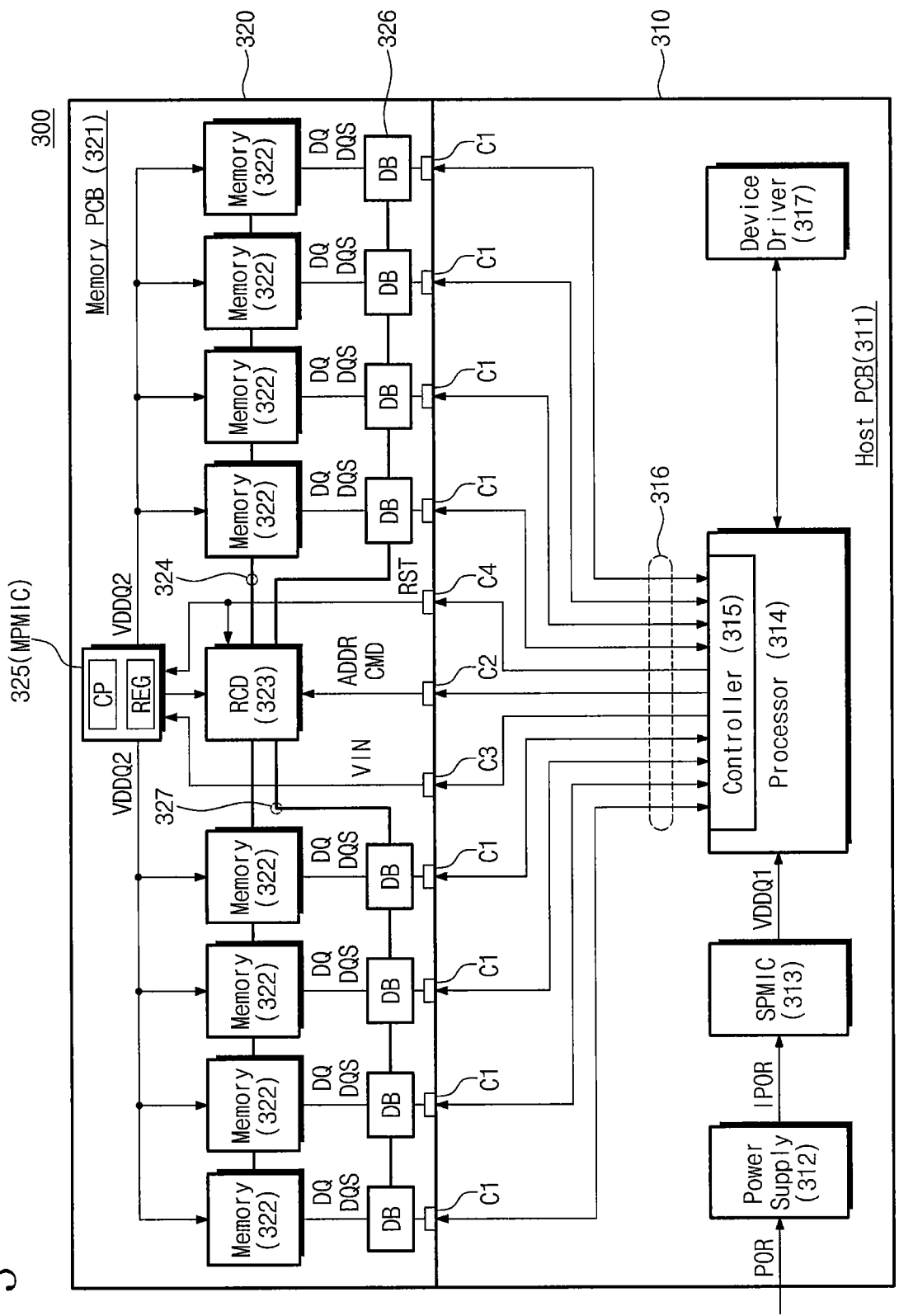
FIG. 3 illustrates a computing system according to some embodiments of the inventive concepts.

FIG. 3 illustrates a computing system 300 according to some embodiments of the inventive concepts. Referring to FIG. 3, the computing system 300 may include a host device 310 and a semiconductor memory module 320. The host device 310 may include a host PCB 311, a power supply 312, an SPMIC 313, a processor 314, and a device driver 317.

The processor 314 may include a controller 315. The controller 315 may be connected to the semiconductor memory module 320 through wires 316. A configuration and an operation of the host device 310 may be the same as those of the host device 210 described with reference to FIG. 2. Thus, additional description will be omitted to avoid redundancy. Unless the description given in the host device 210 of FIG. 2 explicitly differs from that of the host device 310 of FIG. 3 (directly with regard to FIG. 2 or indirectly with reference to any other drawing), the configurations, operations, and characteristics described with regard to the host device 210 of FIG. 2 may be applied to the host device 310 of FIG. 3 without modification.

The semiconductor memory module 320 may include a memory PCB 321, memory devices 322, an RCD 323, and an MPMIC 325. The memory PCB 321 may include the first connectors C1, the second connectors C2, the third connectors C3, and the fourth connector C4.

A configuration and an operation of the semiconductor memory module 320 may be similar to those of the semiconductor memory module 220 described with reference to FIG. 2. Thus, additional description will be omitted to avoid redundancy. Unless the description given in the semiconductor memory module 220 of FIG. 2 explicitly differs from that of the semiconductor memory module 320 of FIG. 3 (directly with regard to FIG. 2 or indirectly with reference to any other drawing), the configurations, operations, and characteristics described with regard to the semiconductor memory module 220 of FIG. 2 may be applied to the semiconductor memory module 320 of FIG. 3 without modification.

Compared to the semiconductor memory module 220 of FIG. 2, the semiconductor memory module 320 may further include data buffers 326. The data buffers 326 may correspond to the memory devices 322 respectively. The data buffers 326 may be interposed between the memory devices 322 and the first connectors C1 and may be configured to relay (or transmit) the data DQ and the data strobe signal DQS.

The memory PCB 321 may further include second wires 327 connecting the RCD 323 and the data buffers 326. The RCD 323 may simultaneously transmit a buffer command (e.g., BCOM) to the data buffers 326 through the second wires 327 to control the data buffers 326.

As described with reference to FIG. 2, the MPMIC 325 may include the register REG and the comparator CP. When the input voltages VIN are supplied, the MPMIC 325 may generate and output the memory voltage VDDQ2 of the default level.

The MPMIC 325 may compare the memory voltage VDDQ2 with the reset signal RST of the inactive state to detect a voltage difference. When the detected voltage difference is greater than the threshold, the MPMIC 325 may update the level information of the register REG such that the memory voltage VDDQ2 is the same as a voltage of the reset signal RST of the inactive state (or is similar to the voltage of the reset signal RST of the inactive state depending on a resolution).

As described with reference to FIG. 2, the MPMIC 325 may update the level information of the register REG when the memory voltage VDDQ2 is adjusted as much as a level corresponding to the detected voltage difference or in a particular unit. The MPMIC 325 may update the level information of the register REG such that the memory voltage VDDQ2 is adjusted in the first unit and the second unit smaller than the first unit.

The MPMIC 325 may perform the calibration operation on the memory voltage VDDQ2 at various times. The MPMIC 325 may perform the calibration operation on the memory voltage VDDQ2 under control of the RCD 323. The RCD 323 may allow the MPMIC 325 to perform the calibration operation depending on a request of the controller 315. The calibration operation that the MPMIC 325 performs on the memory voltage VDDQ2 may be activated and deactivated by the controller 315.

As described with reference to FIG. 2, the reset signal RST may be replaced with any other signal having a high level dominantly. The MPMIC 325 may be modified or changed to compare the memory voltage VDDQ2 with the reset signal RST received from the RCD 323.

The description as given in FIG. 3 is the MPMIC 325 adjusts the memory voltage VDDQ2. However, the MPMIC 325 may be configured to adjust various voltages such as the power supply voltage VDD, the high voltage VPP, the 1.1V output voltage VOUT_1.1V, and the 1.8V output voltage VOUT_1.8V, as well as the memory voltage VDDQ2.

The semiconductor memory module 320 described with reference to FIG. 3 may be organized based on a load reduced DIMM (LRDIMM).

Figure 4:
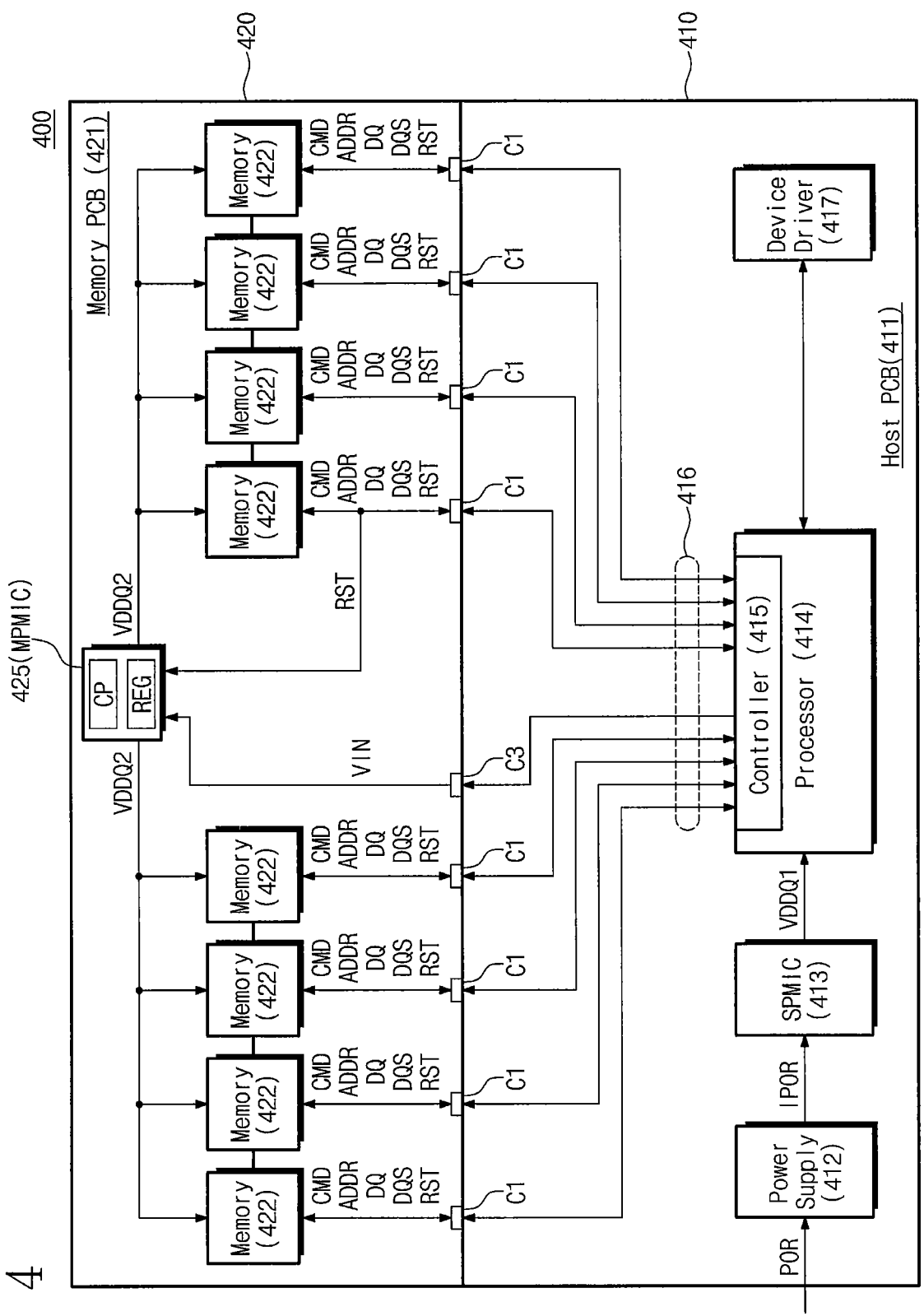
FIG. 4 illustrates a computing system according to some embodiments of the inventive concepts.

FIG. 4 illustrates a computing system 400 according to some embodiments of the inventive concepts. Referring to FIG. 4, the computing system 400 may include a host device 410 and a semiconductor memory module 420. The host device 410 may include a host PCB 411, a power supply 412, an SPMIC 413, a processor 414, and a device driver 417.

The processor 414 may include a controller 415. The controller 415 may be connected to the semiconductor memory module 420 through wires 416. The controller 415 may transmit various signals including the command CMD, the address ADDR, and the reset signal RST to the first connectors C1 through the wires 416. The controller 415 may transmit the input voltages VIN to the third connectors C3 through the wires 416.

A configuration and an operation of the host device 410 may be similar to those of the host device 210 described with reference to FIG. 2. Thus, additional description will be omitted to avoid redundancy. Unless the description given in the host device 210 of FIG. 2 explicitly differs from that of the host device 410 of FIG. 4 (directly with regard to FIG. 2 or indirectly with reference to any other drawing), the configurations, operations, and characteristics described with regard to the host device 210 of FIG. 2 may be applied to the host device 410 of FIG. 4 without modification.

The semiconductor memory module 420 may include a memory PCB 421, memory devices 422, and an MPMIC 425. The memory PCB 421 may include the first connectors C1.

A configuration and an operation of the semiconductor memory module 420 may be similar to those of the semiconductor memory module 220 described with reference to FIG. 2. Thus, additional description will be omitted to avoid redundancy. Unless the description given in the semiconductor memory module 220 of FIG. 2 explicitly differs from that of the semiconductor memory module 420 of FIG. 4 (directly with regard to FIG. 2 or indirectly with reference to any other drawing), the configurations, operations, and characteristics described with regard to the semiconductor memory module 220 of FIG. 2 may be applied to the semiconductor memory module 420 of FIG. 4 without modification.

Compared with the semiconductor memory module 220 of FIG. 2, the semiconductor memory module 420 does not include the RCD 223, the second connectors C2, the fourth connector C4, and the first wires 224. The memory devices 422 may receive various signals including the command CMD, the address ADDR, and the reset signal RST from the first connectors C1, in addition to exchanging the data DQ and the data strobe signal DQS with the first connectors C1.

At least one wire, which conveys the reset signal RST between the memory devices 422 and the first connectors C1, from among the wires on the memory PCB 421 may be extended to the MPMIC 425. That is, the MPMIC 425 may receive the reset signal RST from at least one of the first connectors C1.

As described with reference to FIG. 2, the MPMIC 425 may include the register REG and the comparator CP. When the input voltages VIN are supplied, the MPMIC 425 may generate and output the memory voltage VDDQ2 of the default level.

The MPMIC 425 may compare the memory voltage VDDQ2 with the reset signal RST of the inactive state to detect a voltage difference. When the detected voltage difference is greater than the threshold, the MPMIC 425 may update the level information of the register REG such that the memory voltage VDDQ2 is the same as a voltage of the reset signal RST of the inactive state (or is similar to the voltage of the reset signal RST of the inactive state depending on a resolution).

As described with reference to FIG. 2, the MPMIC 425 may update the level information of the register REG such that the memory voltage VDDQ2 is adjusted as much as a level corresponding to the detected voltage difference or in a particular unit. The MPMIC 425 may update the level information of the register REG such that the memory voltage VDDQ2 is adjusted in the first unit and the second unit smaller than the first unit.

The MPMIC 425 may perform the calibration operation on the memory voltage VDDQ2 at various times. The calibration operation that the MPMIC 425 performs on the memory voltage VDDQ2 may be activated and deactivated by the controller 415.

As described with reference to FIG. 2, the reset signal RST may be replaced with any other signal having a high level dominantly. The MPMIC 425 may be modified or changed to compare the memory voltage VDDQ2 with the reset signal RST received from the controller 415.

The description as given in FIG. 4 is the MPMIC 425 adjusts the memory voltage VDDQ2. However, the MPMIC 425 may be configured to adjust various voltages such as the power supply voltage VDD, the high voltage VPP, the 1.1V output voltage VOUT_1.1V, and the 1.8V output voltage VOUT_1.8V, as well as the memory voltage VDDQ2.

The semiconductor memory module 420 described with reference to FIG. 4 may be organized based on an unbuffered DIMM (UDIMM).

Semiconductor memory modules that are based on the RDIMM, the LRDIMM, and the UDIMM are described with reference to FIGS. 2 to 4. However, the inventive concept is not limited to the RDIMM, the LRDIMM, and the UDIMM. The inventive concepts may be applied to any other memory modules (e.g., a nonvolatile DIMM (NVDIMM) and a small outline DIMM (SODIMM)) that are based on the DIMM. In addition, the inventive concepts may be applied to memory modules including an independent power management integrated circuit.

Figure 5:
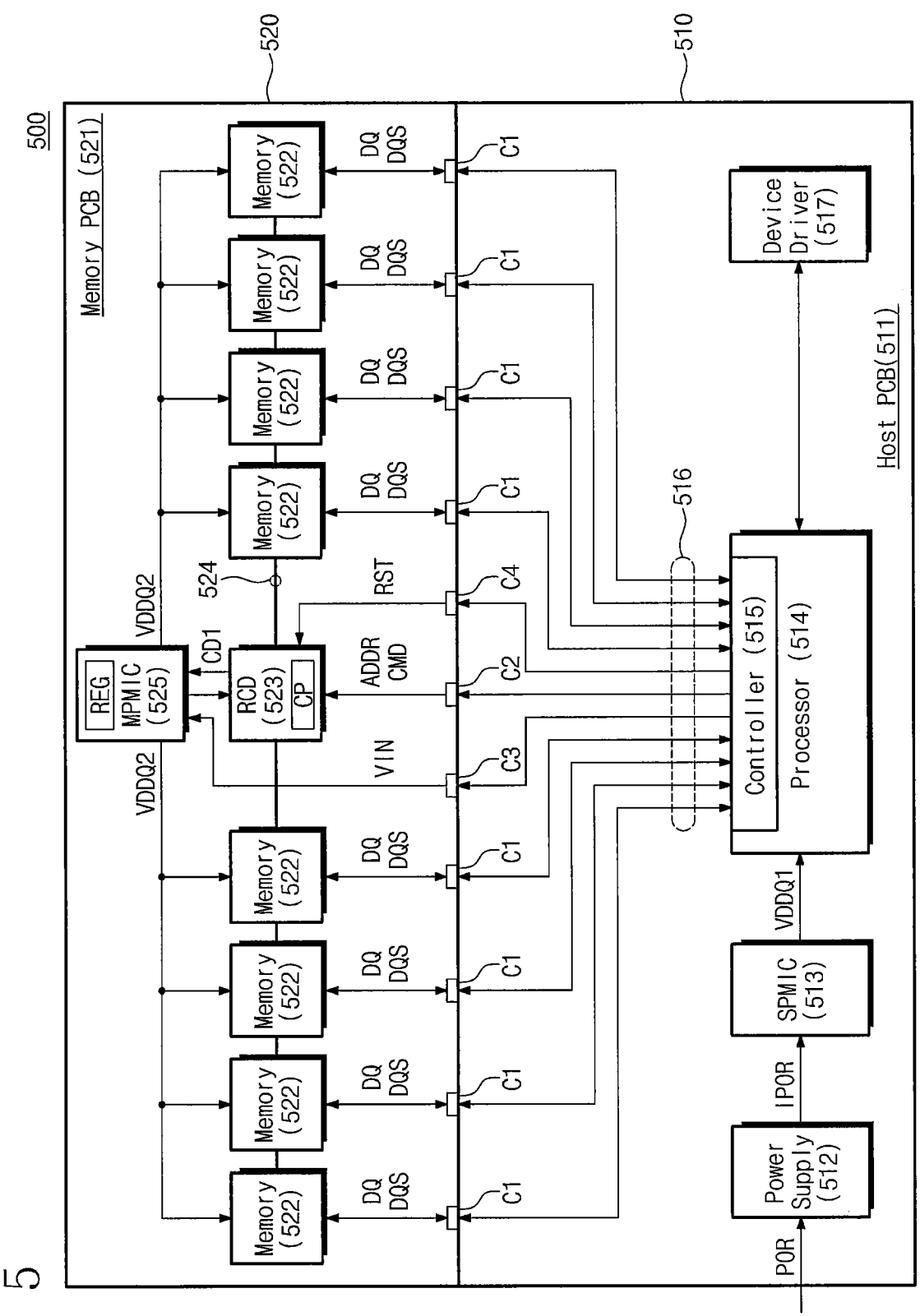
FIG. 5 illustrates a computing system according to some embodiments of the inventive concepts.

FIG. 5 illustrates a computing system 500 according to some embodiments of the inventive concepts. Referring to FIG. 5, the computing system 500 may include a host device 510 and a semiconductor memory module 520. The host device 510 may include a host PCB 511, a power supply 512, an SPMIC 513, a processor 514, and a device driver 517.

The processor 514 may include a controller 515. The controller 515 may be connected to the semiconductor memory module 520 through wires 516. The controller 515 may transmit the data DQ and the data strobe signal DQS to the first connectors C1 through the wires 516. The controller 515 may transmit the command CMD, the address ADDR, and various signals to the second connectors C2 through the wires 516. The controller 515 may transmit the input voltages VIN to the third connectors C3 through the wires 516. The controller 515 may transmit the reset signal RST to the fourth connector C4 through the wires 516.

A configuration and an operation of the host device 510 may be the same as those of the host device 210 described with reference to FIG. 2. Thus, additional description will be omitted to avoid redundancy. Unless the description given in the host device 210 of FIG. 2 explicitly differs from that of the host device 510 of FIG. 5 (directly with regard to FIG. 2 or indirectly with reference to any other drawing), the configurations, operations, and characteristics described with regard to the host device 210 of FIG. 2 may be applied to the host device 510 of FIG. 5 without modification.

The semiconductor memory module 520 may include a memory PCB 521, memory devices 522, an RCD 523, and an MPMIC 525. The memory PCB 521 may include the first connectors C1, the second connectors C2, the third connectors C3, the fourth connector C4, and first wires 524.

A configuration and an operation of the semiconductor memory module 520 may be similar to those of the semiconductor memory module 220 described with reference to FIG. 2. Thus, additional description will be omitted to avoid redundancy. Unless the description given in the semiconductor memory module 520 of FIG. 5 (directly with regard to FIG. 2 or indirectly with reference to any other drawing), the configurations, operations, and characteristics described with regard to the semiconductor memory module 220 of FIG. 2 may be applied to the semiconductor memory module 520 of FIG. 5 without modification.

As described with reference to FIG. 2, the reset signal RST is illustrated as being transferred to the RCD 523 through the fourth connector C4. However, the reset signal RST may be included in various signals that are transferred to the RCD 523 through the second connectors C2.

The RCD 523 may include the comparator CP. The MPMIC 525 may include the register REG. When the input voltages VIN are supplied, the MPMIC 525 may generate and output the memory voltage VDDQ2 of the default level.

The RCD 523 may compare the memory voltage VDDQ2 with the reset signal RST of the inactive state to detect a voltage difference. When the detected voltage difference is greater than the threshold, the RCD 523 may generate a first code CD1 for updating the level information stored in the register REG and may transmit the first code CD1 to the MPMIC 525. The MPMIC 525 may update the level information of the register REG based on the first code CD received from the RCD 523.

The calibration operation that the semiconductor memory module 520 performs on the memory voltage VDDQ2 may be the same as the calibration operation described with reference to FIG. 2, except that the calibration operation associated with the memory voltage VDDQ2 is controlled by the RCD 523.

As described with reference to FIG. 2, the RCD 523 may update the level information of the register REG such that the memory voltage VDDQ2 is adjusted as much as a level corresponding to the detected voltage difference or in a particular unit. The RCD 523 may update the level information of the register REG such that the memory voltage VDDQ2 is adjusted in the first unit and the second unit smaller than the first unit.

The RCD 523 may perform the calibration operation on the memory voltage VDDQ2 at various times. The RCD 523 may perform the calibration operation depending on a request of the controller 515. The calibration operation that the RCD 523 performs on the memory voltage VDDQ2 may be activated and deactivated by the controller 515. As described with reference to FIG. 2, the reset signal RST may be replaced with any other signal having a high level dominantly.

The description as given in FIG. 5 is the RCD 523 adjusts the memory voltage VDDQ2. However, the RCD 523 may be configured to adjust various voltages such as the power supply voltage VDD, the high voltage VPP, the 1.1V output voltage VOUT_1.1V, and the 1.8V output voltage VOUT_1.8V, as well as the memory voltage VDDQ2.

The semiconductor memory module 520 described with reference to FIG. 5 may be organized based on an RDIMM. However, as described with reference to FIGS. 3 and 4, the semiconductor memory module 520 may be implemented with various memory modules, each of which includes the RCD 523, such as an LRDIMM and an NVDIMM.

Figure 6:
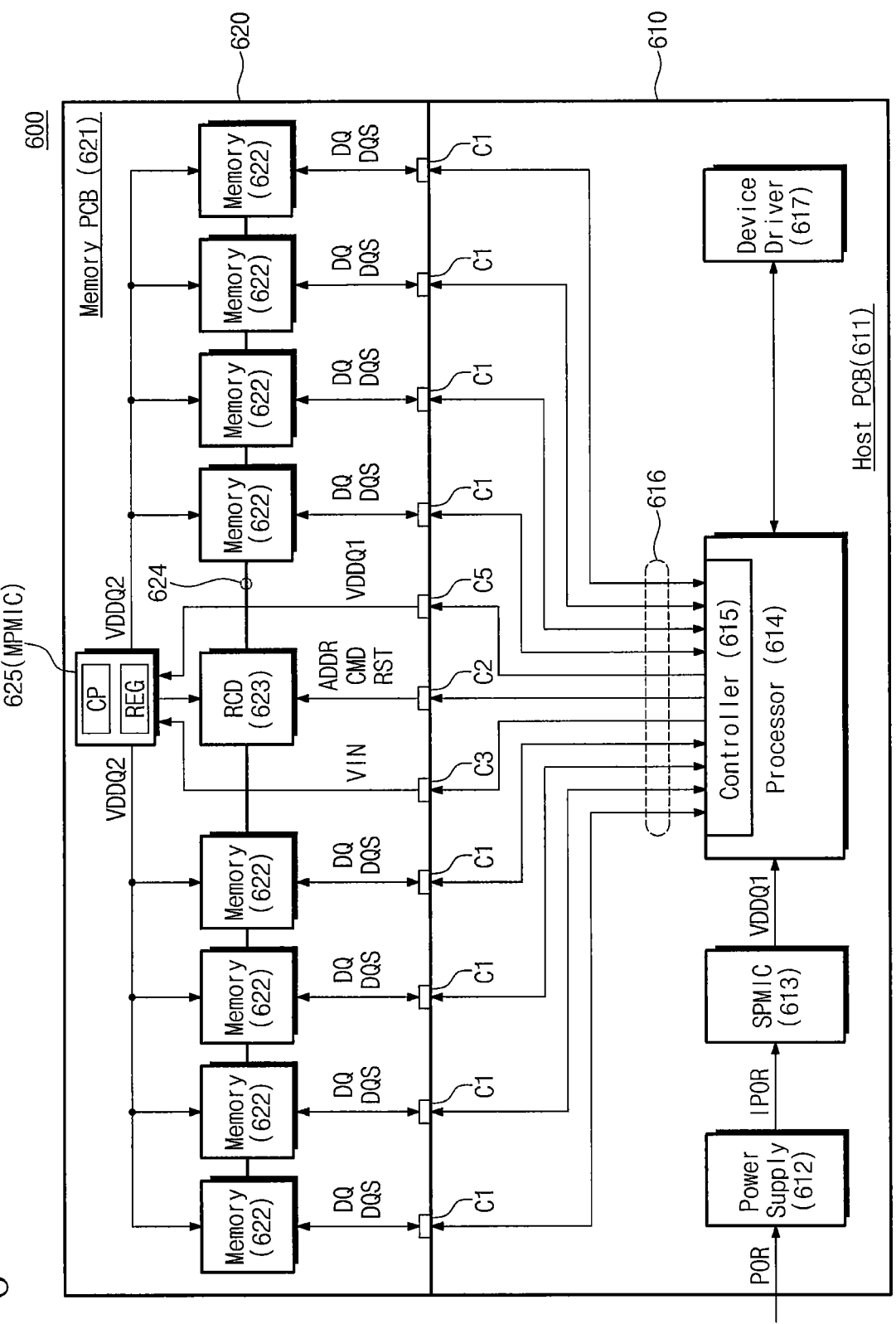
FIG. 6 illustrates a computing system according to some embodiments of the inventive concepts.

FIG. 6 illustrates a computing system 600 according to some embodiments of the inventive concepts. Referring to FIG. 6, the computing system 600 may include a host device 610 and a semiconductor memory module 620. The host device 610 may include a host PCB 611, a power supply 612, an SPMIC 613, a processor 614, and a device driver 617.

The processor 614 may include a controller 615. The controller 615 may be connected to the semiconductor memory module 620 through wires 616. The controller 515 may transmit the data DQ and the data strobe signal DQS to the first connectors C1 through the wires 616. The controller 615 may transmit various signals including the command CMD, the address ADDR, and the reset signal RST to the second connectors C2 through the wires 616. The controller 615 may transmit the input voltages VIN to the third connectors C3 through the wires 616. The controller 615 may transmit the host voltage VDDQ1 to a fifth connector C5 through the wires 616.

To transmit the host voltage VDDQ1, at least one of solder balls of the processor 614 may be allocated to an output of the host voltage VDDQ1. A dedicated wire for connecting the at least one solder ball thus allocated and the fifth connector C5 may be disposed on the host PCB 611 as a part of the wires 616.

A configuration and an operation of the host device 610 may be similar to those of the host device 210 described with reference to FIG. 2. Thus, additional description will be omitted to avoid redundancy. Unless the description given in the host device 210 of FIG. 2 explicitly differs from that of the host device 610 of FIG. 6 (directly with regard to FIG. 2 or indirectly with reference to any other drawing), the configurations, operations, and characteristics described with regard to the host device 210 of FIG. 2 may be applied to the host device 610 of FIG. 6 without modification.

The semiconductor memory module 620 may include a memory PCB 621, memory devices 622, an RCD 623, and an MPMIC 625. The memory PCB 621 may include the first connectors C1, the second connectors C2, the third connectors C3, the fifth connector C5, and first wires 624.

A configuration and an operation of the semiconductor memory module 620 may be similar to those of the semiconductor memory module 220 described with reference to FIG. 2. Thus, additional description will be omitted to avoid redundancy. Unless the description given in the semiconductor memory module 220 of FIG. 2 explicitly differs from that of the semiconductor memory module 620 of FIG. 6 (directly with regard to FIG. 2 or indirectly with reference to any other drawing), the configurations, operations, and characteristics described with regard to the semiconductor memory module 220 of FIG. 2 may be applied to the semiconductor memory module 620 of FIG. 6 without modification.

The memory PCB 621 may further include a wire for transferring the host voltage VDDQ1 provided through the fifth connector C5 to the MPMIC 625. The MPMIC 625 may compare the memory voltage VDDQ2 with the host voltage VDDQ1 instead of the reset signal RST and may detect a voltage difference. When the detected difference is greater than the threshold, the MPMIC 625 may update the level information of the register REG such that the memory voltage VDDQ2 is the same as the host voltage VDDQ1 (or is similar to the host voltage VDDQ1 depending on a resolution).

Unlike signals that are used for the communication between the semiconductor memory module 620 and the host device 610, the host voltage VDDQ1 may always maintain a uniform level. Accordingly, the MPMIC 625 may perform the calibration operation anytime while the power POR is supplied to the computing system 600

As described with reference to FIG. 2, the MPMIC 625 may update the level information of the register REG such that the memory voltage VDDQ2 is adjusted as much as a level corresponding to the detected voltage difference or in a particular unit. The MPMIC 625 may update the level information of the register REG such that the memory voltage VDDQ2 is adjusted in the first unit and the second unit smaller than the first unit.

The MPMIC 625 may perform the calibration operation on the memory voltage VDDQ2 at various times. The MPMIC 625 may perform the calibration operation on the memory voltage VDDQ2 under control of the RCD 623. The RCD 623 may allow the MPMIC 625 to perform the calibration operation depending on a request of the controller 615. The calibration operation that the MPMIC 625 performs on the memory voltage VDDQ2 may be activated and deactivated by the controller 615.

The description as given in FIG. 6 is the MPMIC 625 adjusts the memory voltage VDDQ2. However, the MPMIC 625 may be configured to adjust various voltages such as the power supply voltage VDD, the high voltage VPP, the 1.1V output voltage VOUT_1.1V, and the 1.8V output voltage VOUT_1.8V, as well as the memory voltage VDDQ2.

The semiconductor memory module 620 described with reference to FIG. 6 may be organized based on an RDIMM. However, as described with reference to FIGS. 3 and 4, the semiconductor memory module 620 may be implemented with various memory modules such as an LRDIMM, an UDIMM, an SODIMM, and an NVDIMM.

Figure 7:
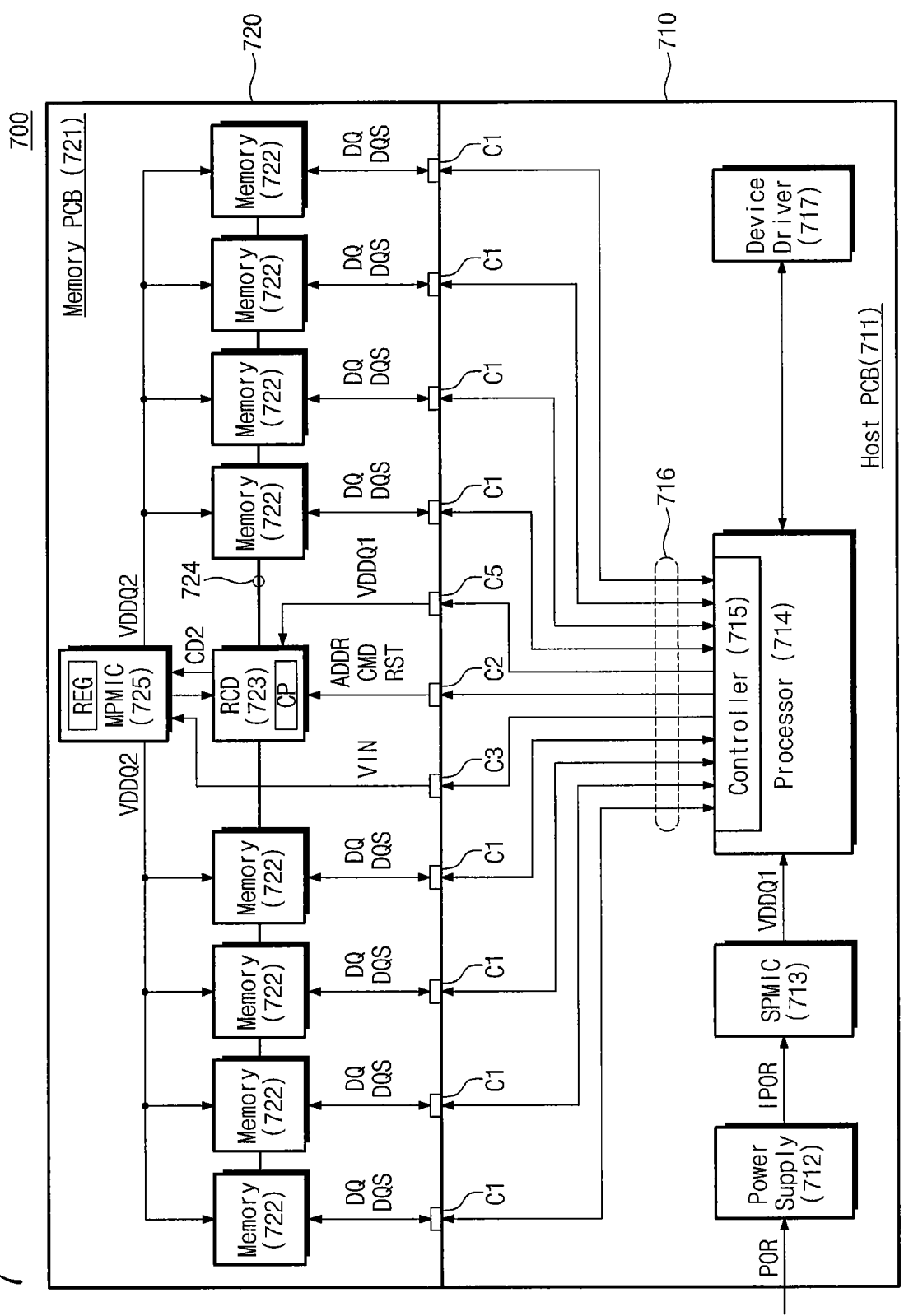
FIG. 7 illustrates a computing system according to some embodiments of the inventive concepts.

FIG. 7 illustrates a computing system 700 according to some embodiments of the inventive concepts. Referring to FIG. 7, the computing system 700 may include a host device 710 and a semiconductor memory module 720. The host device 710 may include a host PCB 711, a power supply 712, an SPMIC 713, a processor 714, and a device driver 717.

The processor 714 may include a controller 715. The controller 715 may be connected to the semiconductor memory module 720 through wires 716. The controller 715 may transmit the data DQ and the data strobe signal DQS to the first connectors C1 through the wires 716. The controller 715 may transmit various signals including the command CMD, the address ADDR, and the reset signal RST to the second connectors C2 through the wires 716. The controller 715 may transmit the input voltages VIN to the third connectors C3 through the wires 716. The controller 715 may transmit the host voltage VDDQ1 to the fifth connector C5 through the wires 716.

A configuration and an operation of the host device 710 may be the same as those of the host device 610 described with reference to FIG. 6. Thus, additional description will be omitted to avoid redundancy. Unless the description given in the host device 610 of FIG. 6 explicitly differs from that of the host device 710 of FIG. 7 (directly with regard to FIG. 6 or indirectly with reference to any other drawing), the configurations, operations, and characteristics described with regard to the host device 610 of FIG. 6 may be applied to the host device 710 of FIG. 7 without modification.

The semiconductor memory module 720 may include a memory PCB 721, memory devices 722, an RCD 723, and an MPMIC 725. The memory PCB 721 may include the first connectors C1, the second connectors C2, the third connectors C3, the fifth connector C5, and first wires 724.

A configuration and an operation of the computing system 700 may be similar to those of the computing system 500 described with reference to FIG. 5, except for comparing the memory voltage VDDQ2 with the host voltage VDDQ1 instead of the reset signal RST. Also, a configuration and an operation of the computing system 700 may be similar to those of the computing system 600 described with reference to FIG. 6, except that the comparator CP is disposed in the RCD 723.

Thus, additional description will be omitted to avoid redundancy. Unless the description given in the computing system 500 or 600 of FIG. 5 or 6 explicitly differs from that of the computing system 700 of FIG. 7 (directly with regard to FIG. 5 or 6 or indirectly with reference to any other drawing), the configurations, operations, and characteristics described with regard to the computing system 500 or 600 of FIG. 5 or 6 may be applied to the computing system 700 of FIG. 7 without modification.

Figure 8:
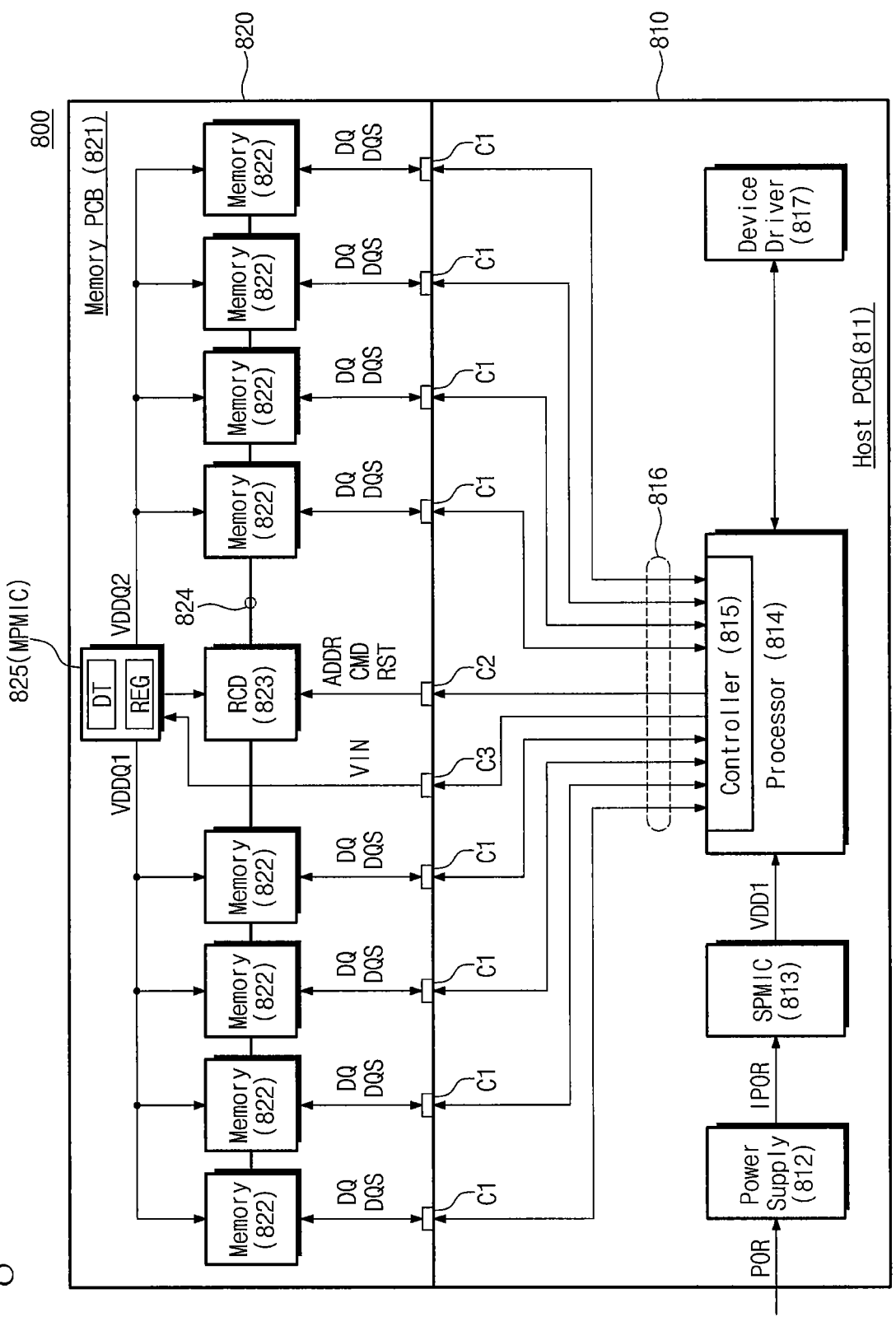
FIG. 8 illustrates a computing system according to some embodiments of the inventive concepts.

FIG. 8 illustrates a computing system 800 according to some embodiments of the inventive concepts. Referring to FIG. 8, the computing system 800 may include a host device 810 and a semiconductor memory module 820. The host device 810 may include a host PCB 811, a power supply 812, an SPMIC 813, a processor 814, and a device driver 817.

The processor 814 may include a controller 815. The controller 815 may be connected to the semiconductor memory module 820 through wires 816. The controller 815 may transmit the data DQ and the data strobe signal DQS to the first connectors C1 through the wires 816. The controller 815 may transmit various signals including the command CMD, the address ADDR, and the reset signal RST to the second connectors C2 through the wires 816. The controller 815 may transmit the input voltages VIN to the third connectors C3 through the wires 816.

A configuration and an operation of the host device 810 may be similar to those of the host device 210 described with reference to FIG. 2. Thus, additional description will be omitted to avoid redundancy. Unless the description given in the host device 210 of FIG. 2 explicitly differs from that of the host device 810 of FIG. 8 (directly with regard to FIG. 2 or indirectly with reference to any other drawing), the configurations, operations, and characteristics described with regard to the host device 210 of FIG. 2 may be applied to the host device 810 of FIG. 8 without modification.

The semiconductor memory module 820 may include a memory PCB 821, memory devices 822, an RCD 823, and an MPMIC 825. The memory PCB 821 may include the first connectors C1, the second connectors C2, the third connectors C3, and first wires 824.

A configuration and an operation of the semiconductor memory module 820 may be similar to those of the semiconductor memory module 220 described with reference to FIG. 2. Thus, additional description will be omitted to avoid redundancy. Unless the description given in the semiconductor memory module 220 of FIG. 2 explicitly differs from that of the semiconductor memory module 820 of FIG. 8 (directly with regard to FIG. 2 or indirectly with reference to any other drawing), the configurations, operations, and characteristics described with regard to the semiconductor memory module 220 of FIG. 2 may be applied to the semiconductor memory module 820 of FIG. 8 without modification.

The MPMIC 825 may include the register REG and a detector DT. When the input voltages VIN are supplied, the MPMIC 825 may generate and output the memory voltage VDDQ2 of the default level.

The detector DT may be configured to detect the amount of current that is output from the MPMIC 825. For example, when the semiconductor memory module 820 does not communicate with the controller 815, the detector DT may detect the amount of current that is output from the MPMIC 825.

A current that flows when the semiconductor memory module 820 does not communicate with the controller 815 (e.g., in a communication-less period) may be considered as a DC current between the semiconductor memory module 820 and the controller 815 described above. The MPMIC 825 may update the level information stored in the register REG when the amount of current thus detected is greater than a threshold.

For example, when the memory voltage VDDQ2 is lower than the host voltage VDDQ1, a DC current may flow from the controller 815 to the semiconductor memory module 820. In this case, the amount of current that is output from the MPMIC 825 in the communication-less period may not exist or may be small.

When the memory voltage VDDQ2 is higher than the host voltage VDDQ1, a DC current may flow from the semiconductor memory module 820 to the controller 815. In this case, the amount of current that is output from the MPMIC 825 in the communication-less period may be greater than the threshold.

In the calibration operation, the MPMIC 825 may detect a change in the amount of current while adjusting the level information of the register REG. The MPMIC 825 may adjust the level information such that the memory voltage VDDQ2 gradually increases from level information corresponding to the case where the amount of current may not exist or may be small in the communication-less period.

The MPMIC 825 may detect level information corresponding to the case where the amount of current is greater than the threshold in the communication-less period. The MPMIC 825 may update the level information so as to indicate a level immediately below the memory voltage VDDQ2 corresponding to the detected level information.

The MPMIC 825 may update the level information of the register REG such that the memory voltage VDDQ2 is adjusted in the first unit (e.g., coarse calibration) and may then update the level information of the register REG such that the memory voltage VDDQ2 is adjusted in the second unit smaller than the first unit (e.g., fine calibration).

The MPMIC 825 may perform the calibration operation on the memory voltage VDDQ2 at various times. For example, the MPMIC 825 may perform the calibration operation on the memory voltage VDDQ2 during a given time after the reset signal RST is activated and is deactivated.

In an embodiment, the RCD 823 may detect a communication-less period and may allow the MPMIC 825 to perform the calibration operation on the memory voltage VDDQ2. The RCD 823 may allow the MPMIC 825 to perform the calibration operation on the memory voltage VDDQ2 during a given time after the reset signal RST is activated and is deactivated.

The RCD 823 may allow the MPMIC 825 to perform the calibration operation depending on a request of the controller 815. For example, when a particular signal of control signals received through the second connectors C2 is activated, the RCD 823 may allow the MPMIC 825 to perform the calibration operation on the memory voltage VDDQ2.

The calibration operation may be activated or deactivated by the controller 815. When the calibration operation is activated, the MPMIC 825 may perform the calibration operation in response to the event that a condition for performing the calibration operation is satisfied. When the calibration operation is deactivated, the MPMIC 825 may not perform the calibration operation even though a condition for performing the calibration operation is satisfied. The condition for performing the calibration operation may include the time, the request, etc. described above.

The description as given in FIG. 8 is the MPMIC 825 adjusts the memory voltage VDDQ2. However, the MPMIC 825 may be configured to adjust various voltages such as the power supply voltage VDD, the high voltage VPP, the 1.1V output voltage VOUT_1.1V, and the 1.8V output voltage VOUT_1.8V, as well as the memory voltage VDDQ2.

The semiconductor memory module 820 described with reference to FIG. 8 may be organized based on an RDIMM. However, as described with reference to FIGS. 3 and 4, the semiconductor memory module 820 may be implemented with various memory modules, each of which includes the RCD 823, such as an LRDIMM and an NVDIMM.

Figure 9:
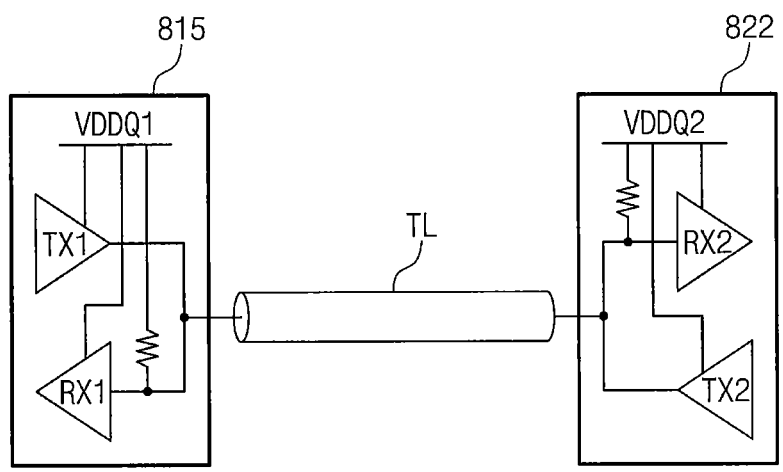
FIG. 9 illustrates examples of structures of a controller and a memory device, which may be used to generate a DC current.

FIG. 9 illustrates examples of structures of the controller 815 and the memory devices 822, which may generate a DC current. In an embodiment, an example of one transmission and reception block of the controller 815 and one transmission and reception block of the memory device 822 is illustrated in FIG. 9. Referring to FIGS. 8 and 9, the transmission and reception block of the controller 815 may include a first transmitter TX1 and a first receiver RX1.

The transmission and reception block of the memory device 822 may include a second transmitter TX2 and a second receiver RX2. The transmission and reception block of the controller 815 and the transmission and reception block of the memory device 822 may be connected through a modeled transmission line TL.

The first transmitter TX1 and the first receiver RX1 of the controller 815 may be terminated with the host voltage VDDQ1. The second transmitter TX2 and the second receiver RX2 of the memory device 822 may be terminated with the memory voltage VDDQ2. A structure in which different devices connected through the transmission line TL are terminated with voltages of a high level may be a pseudo open drain (POD) structure.

In the case where the transmission and reception block of the controller 815 and the transmission and reception block of the memory device 822 are respectively terminated with the host voltage VDDQ1 and the memory voltage VDDQ2 and the controller 815 and the semiconductor memory module 820 are electrically connected, a DC current may flow when there is a difference between the host voltage VDDQ1 and the memory voltage VDDQ2. Accordingly, it may be easy to detect a DC current and to perform the calibration operation.

Figure 10:
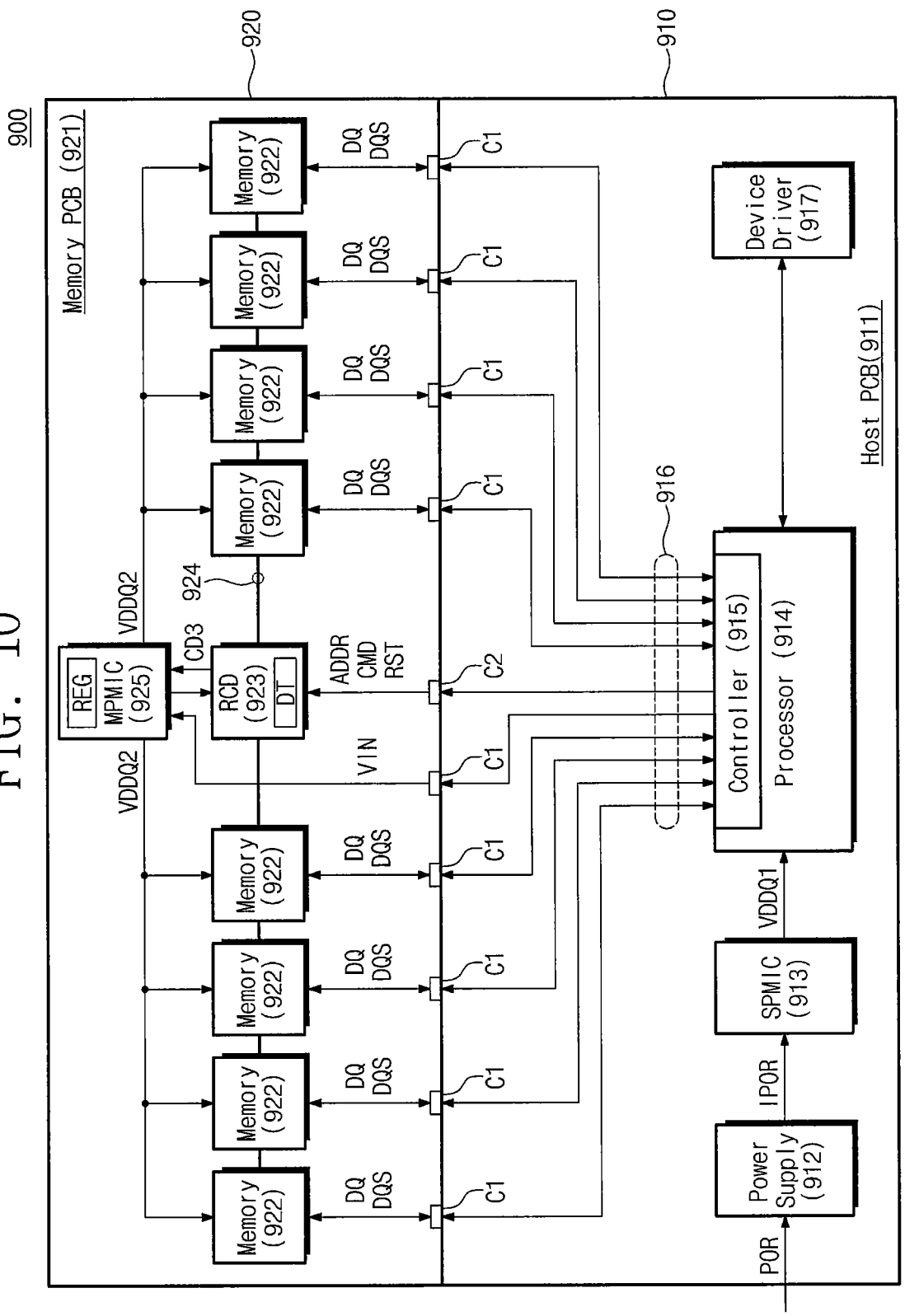
FIG. 10 illustrates a computing system according to some embodiments of the inventive concepts.

FIG. 10 illustrates a computing system 900 according to some embodiments of the inventive concepts. Referring to FIG. 10, the computing system 900 may include a host device 910 and a semiconductor memory module 920. The host device 910 may include a host PCB 911, a power supply 912, an SPMIC 913, a processor 914, and a device driver 917.

The processor 914 may include a controller 915. The controller 915 may be connected to the semiconductor memory module 920 through wires 916. The semiconductor memory module 920 may include a memory PCB 921, memory devices 922, an RCD 923, and an MPMIC 925. The memory PCB 921 may include the first connectors C1, the second connectors C2, the third connectors C3, and first wires 924.

The computing system 900 is the same as the computing system 800 described with reference to FIG. 8, except that the detector DT is disposed in the RCD 923. The detector DT may detect the amount of current in a communication-less period. The RCD 923 may output the amount of current thus detected or a third code CD3 for updating level information to the MPMIC 925. When the third code CD3 includes the amount of current, the MPMIC 925 may update the level information based on the third code CD3.

Unless the description given in the computing system 800 of FIG. 8 explicitly differs from that of the computing system 900 of FIG. 10 (directly with regard to FIG. 8 or indirectly with reference to any other drawing), the configurations, operations, and characteristics described with regard to the computing system 800 of FIG. 8 may be applied to the computing system 900 of FIG. 10 without modification.

Figure 11:
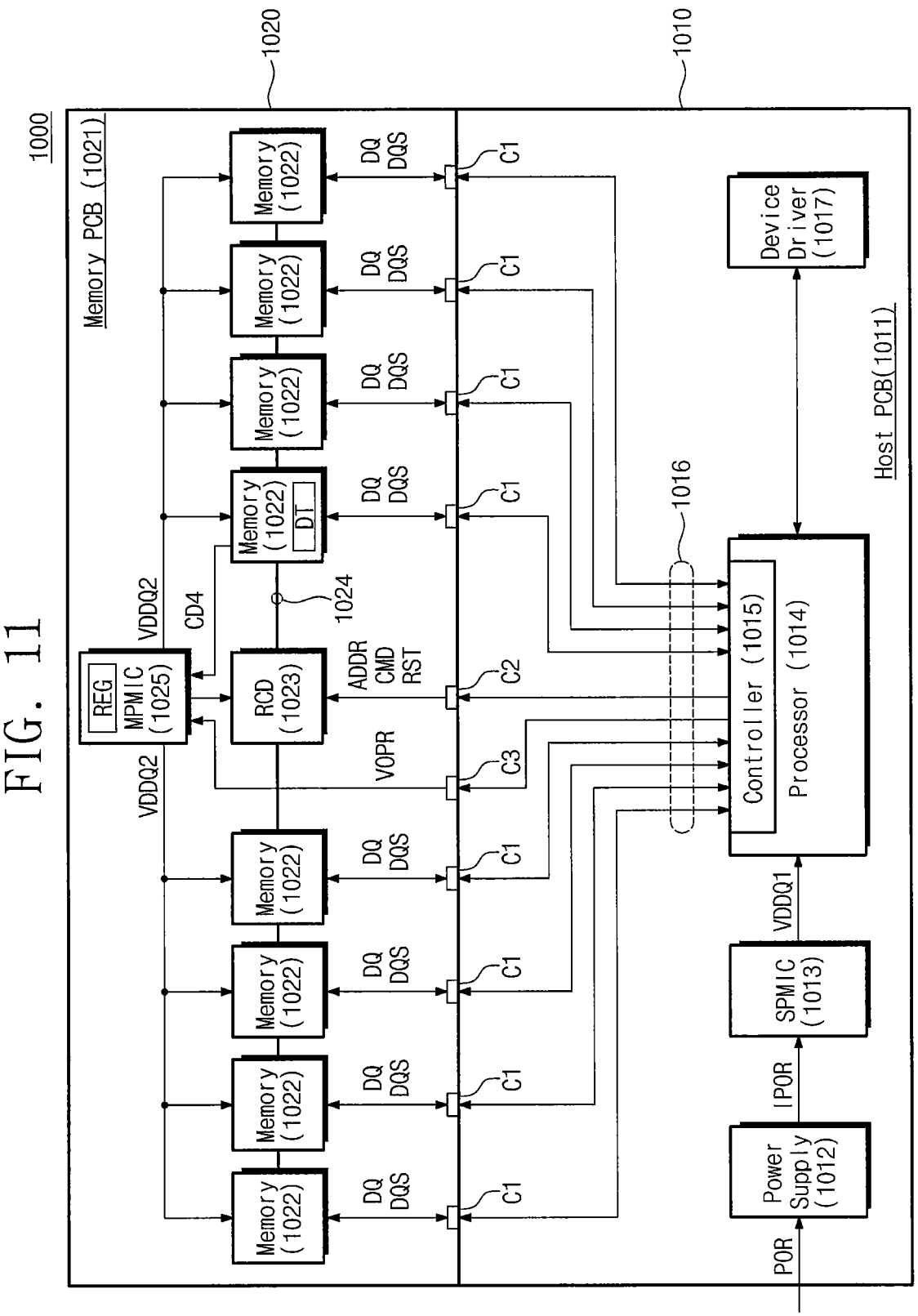
FIG. 11 illustrates a computing system according to some embodiments of the inventive concepts.

FIG. 11 illustrates a computing system 1000 according to some embodiments of the inventive concepts. Referring to FIG. 11, the computing system 1000 may include a host device 1010 and a semiconductor memory module 1020. The host device 1010 may include a host PCB 1011, a power supply 1012, an SPMIC 1013, a processor 1014, and a device driver 1017.

The processor 1014 may include a controller 1015. The controller 1015 may be connected to the semiconductor memory module 1020 through wires 1016. The semiconductor memory module 1020 may include a memory PCB 1021, memory devices 1022, an RCD 1023, and an MPMIC 1025. The memory PCB 1021 may include the first connectors C1, the second connectors C2, the third connectors C3, and first wires 1024.

The computing system 1000 is the same as the computing system 800 described with reference to FIG. 8, except that the detector DT is disposed in at least one of the memory devices 1022. The detector DT may detect the amount of current in a communication-less period. The at least one memory device 1022 may output the amount of current thus detected or a fourth code CD4 for updating level information. When the fourth code CD4 includes the amount of current, the MPMIC 1025 may update the level information based on the fourth code CD4.

Unless the description given in the computing system 800 of FIG. 8 explicitly differs from that of the computing system 1000 of FIG. 11 (directly with regard to FIG. 8 or indirectly with reference to any other drawing), the configurations, operations, and characteristics described with regard to the computing system 800 of FIG. 8 may be applied to the computing system 1000 of FIG. 11 without modification.

Figure 12:
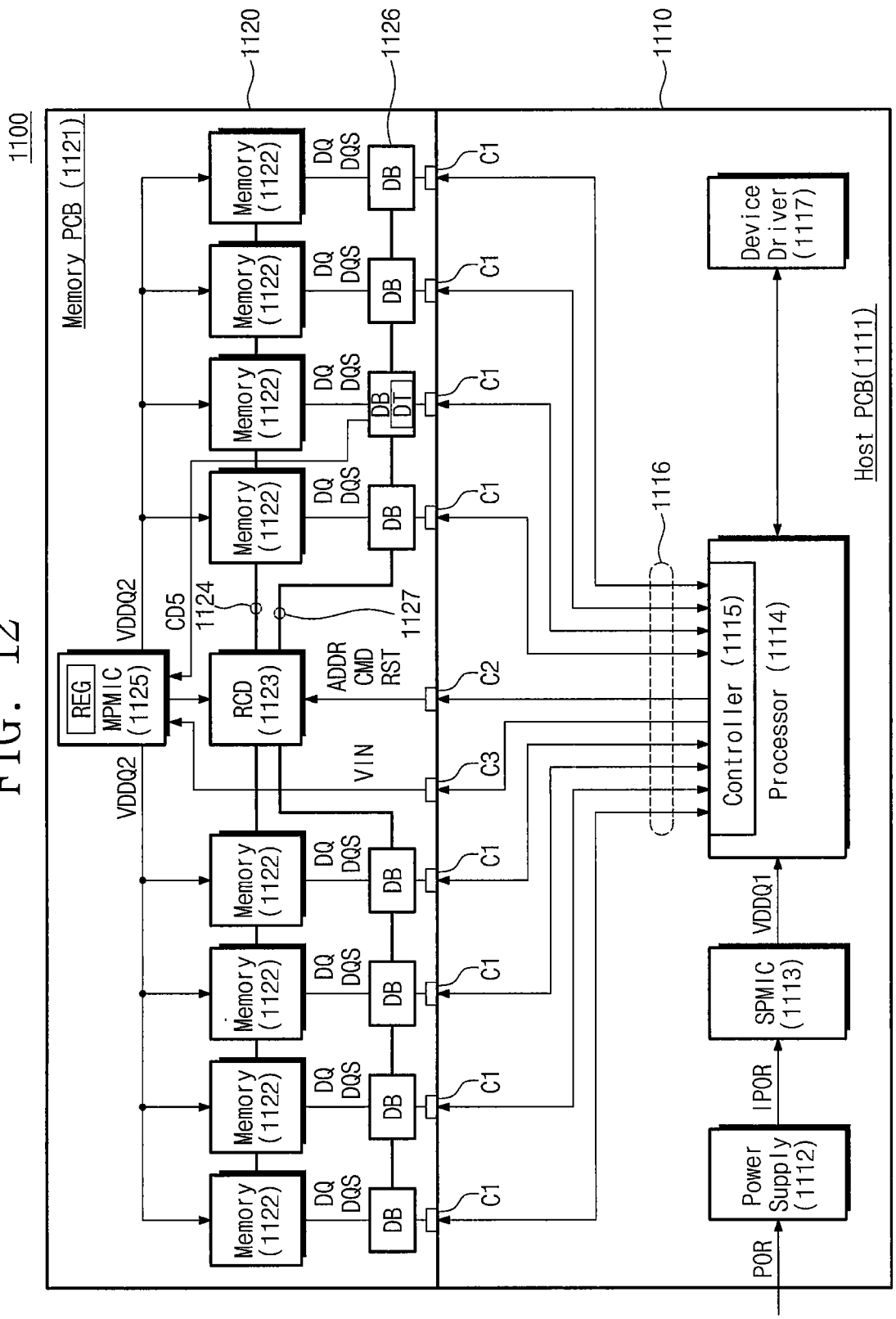
FIG. 12 illustrates a computing system according to some embodiments of the inventive concepts.

FIG. 12 illustrates a computing system 1100 according to some embodiments of the inventive concepts. Referring to FIG. 12, the computing system 1100 may include a host device 1110 and a semiconductor memory module 1120. The host device 1110 may include a host PCB 1111, a power supply 1112, an SPMIC 1113, a processor 1114, and a device driver 1117.

The processor 1114 may include a controller 1115. The controller 1115 may be connected to the semiconductor memory module 1120 through wires 1116. The semiconductor memory module 1120 may include a memory PCB 1121, memory devices 1122, an RCD 1123, an MPMIC 1125, and data buffers 1126. The memory PCB 1121 may include the first connectors C1, the second connectors C2, the third connectors C3, first wires 1124, and second wires 1127.

The computing system 1100 is the same as the computing system 800 described with reference to FIG. 8, except for the data buffers 1126 and the detector DT. The detector DT may be disposed in at least one of the data buffers 1126. The detector DT may detect the amount of current in a communication-less period.

The at least one data buffer 1126 may output the amount of current thus detected or a fifth code CD5 for updating level information. When the fifth code CD5 includes the amount of current, the MPMIC 1125 may update the level information based on the fifth code CD5.

The data buffers 1126 may be configured to transfer the data DQ and the data strobe signal DQS between the memory devices 1122 and the first connectors C1. The data buffers 1126 may be controlled by the buffer command BCOM that is transferred from the RCD 1123 through the second wires 1127.

Unless the description given in the computing system 800 of FIG. 8 explicitly differs from the computing system 1100 of FIG. 12 (directly with regard to FIG. 8 or indirectly with reference to any other drawing), the configurations, operations, and characteristics described with regard to the computing system 800 of FIG. 8 may be applied to the computing system 1100 of FIG. 12 without modification.

Figure 13:
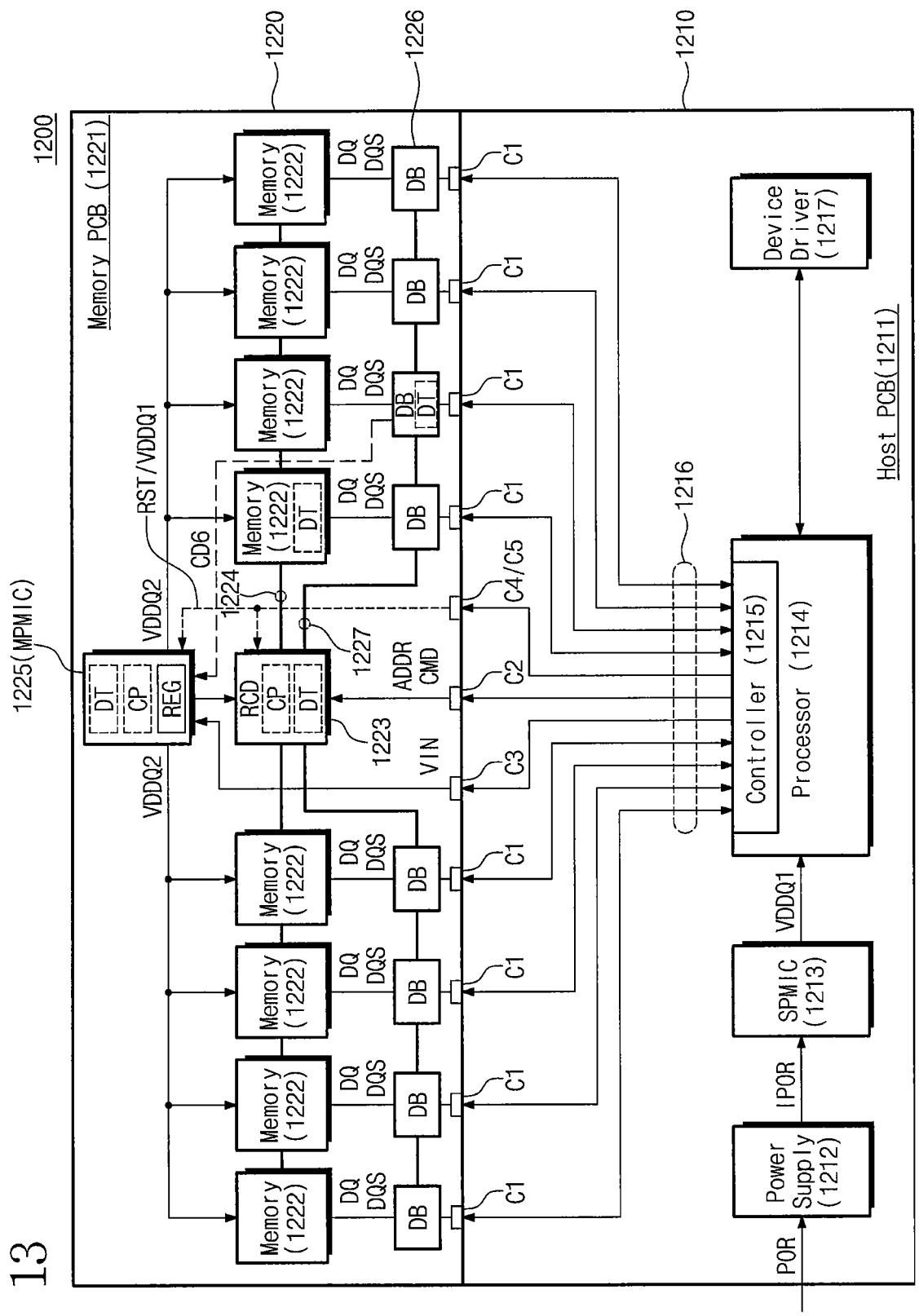
FIG. 13 illustrates a computing system according to some embodiments of the inventive concepts.

FIG. 13 illustrates a computing system 1200 according to some embodiments of the inventive concepts. Referring to FIG. 13, the computing system 1200 may include a host device 1210 and a semiconductor memory module 1220. The host device 1210 may include a host PCB 1211, a power supply 1212, an SPMIC 1213, a processor 1214, and a device driver 1217.

The processor 1214 may include a controller 1215. The controller 1215 may be connected to the semiconductor memory module 1220 through wires 1216. The semiconductor memory module 1220 may include a memory PCB 1221, memory devices 1222, an RCD 1223, an MPMIC 1225, and data buffers 1226. The memory PCB 1221 may include the first connectors C1, the second connectors C2, the third connectors C3, first wires 1224, and second wires 1227.

As described with reference to FIGS. 2 to 8, the semiconductor memory module 1220 may perform the calibration operation on the memory voltage VDDQ2 based on a voltage difference. The comparator CP may be disposed in the RCD 1223 or the MPMIC 1225. The memory voltage VDDQ2 may be compared with the reset signal RST or the host voltage VDDQ1 received through the fourth connector C4 or the fifth connector C5.

As described with reference to FIGS. 8 to 12, the semiconductor memory module 1220 may perform the calibration operation on the memory voltage VDDQ2 based on the amount of current. The detector DT may be disposed in the MPMIC 1225, the RCD 1223, at least one memory device 1222, or at least one data buffer 1226.

Unless mentioned as explicitly different from the description given in the computing systems 200 to 1100 of FIGS. 2 to 12, the configurations, operations, and characteristics described with regard to the computing systems 200 to 1100 of FIGS. 2 to 12 may be applied to the computing system 1200 of FIG. 13 without modification.

Figure 14:
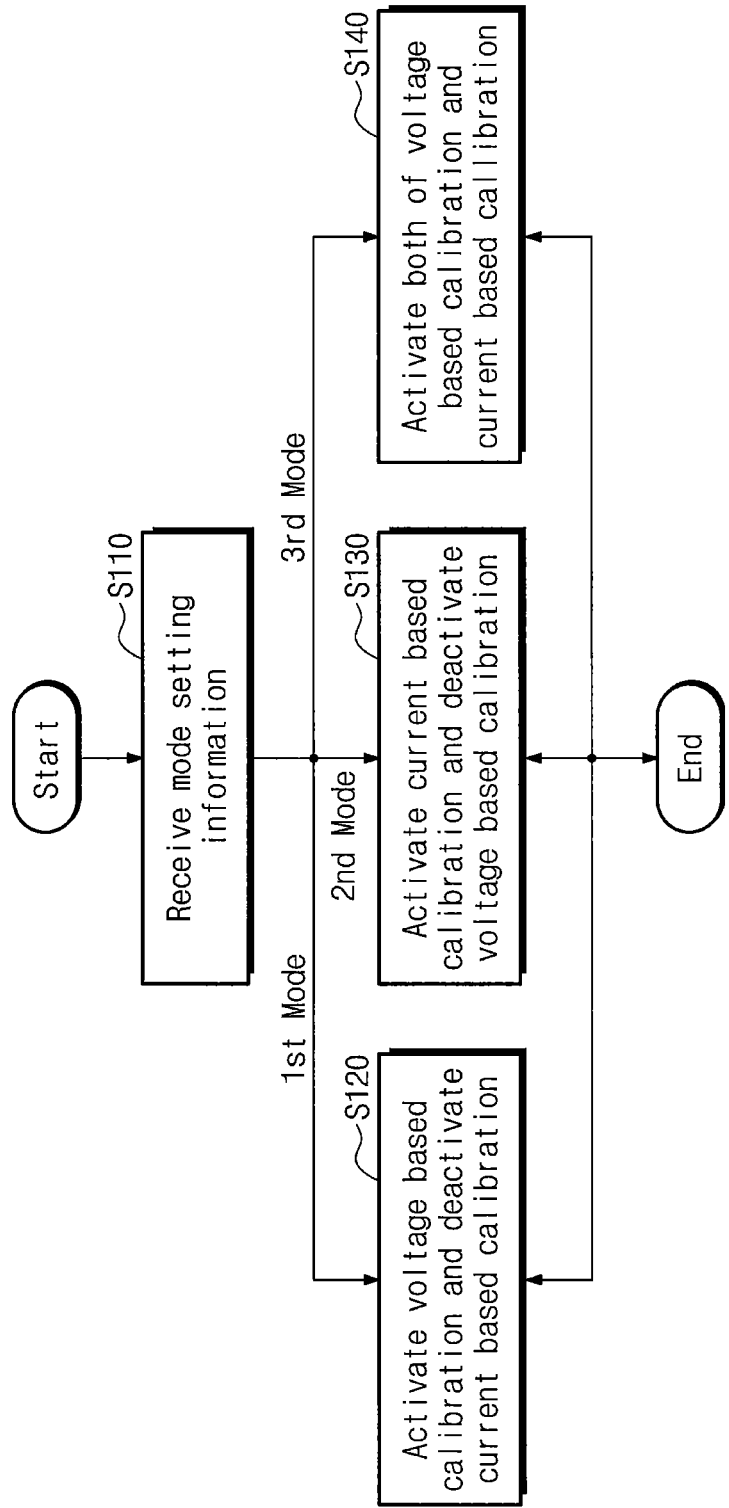
FIG. 14 is a flowchart illustrating an operating method of a memory module according to some embodiments of the inventive concepts.

FIG. 14 is a flowchart illustrating an operating method of the semiconductor memory module 1220 according to some embodiments of the inventive concept. Referring to FIGS. 13 and 14, in operation S110, the semiconductor memory module 1220 may receive mode setting information from the controller 1215. The mode setting information may be used to set a mode of the calibration operation of the semiconductor memory module 1220. The mode setting information may be received immediately after an initialization operation or at any necessary time.

When the mode setting information indicates a first mode, in operation S120, the semiconductor memory module 1220 may activate a voltage-based calibration operation and may deactivate a current-based calibration operation. That is, the comparator CP may be activated, and the detector DT may be deactivated.

When the mode setting information indicates a second mode, in operation S130, the semiconductor memory module 1220 may activate the current-based calibration operation and may deactivate the voltage-based calibration operation. That is, the comparator CP may be deactivated, and the detector DT may be activated.

When the mode setting information indicates a third mode, in operation S140, the semiconductor memory module 1220 may activate both the voltage-based calibration operation and the current-based calibration operation. That is, both the comparator CP and the detector DT may be activated.

In addition, in the third mode, depending on the mode setting information, the semiconductor memory module 1220 may select a calibration operation to be first applied from among the voltage-based calibration operation and the current-based calibration operation and may then select a calibration operation to be used for verification.

As well as the first mode, the second mode, and the third mode, another mode in which there are deactivated both the voltage-based calibration operation and the current-based calibration operation, for example, a fourth mode may be set based on the mode setting information.

According to the inventive concepts, a power management integrated circuit of a semiconductor memory module may adjust a memory voltage so as to correspond with a host voltage. Accordingly, because a DC current is not generated, a semiconductor memory module having reduced power consumption and having improved reliability is provided.

While the inventive concepts have been described with reference to exemplary embodiments thereof, it will be apparent to those of ordinary skill in the art that various changes and modifications may be made thereto without departing from the scope of the inventive concepts as set forth in the following claims.

What is claimed is:

1. A semiconductor memory module comprising:
a memory printed circuit board (PCB) including first connectors, a second connector, and a third connector, the first, second, and third connectors configured to be connectable with an external device;
memory devices mounted on the memory PCB and connected with the first connectors; and
a power management integrated circuit mounted on the memory PCB, wherein the power management integrated circuit is configured to receive a first voltage through the second connector, to generate a second voltage from the first voltage, and to supply the second voltage to the memory devices, and
wherein the power management integrated circuit is further configured to adjust the second voltage depending on a difference between a signal received through the third connector and the second voltage.

2. The semiconductor memory module of claim 1, wherein the power management integrated circuit is further configured to directly receive the signal from the third connector and to compare the signal and the second voltage to detect the difference.

3. The semiconductor memory module of claim 2, wherein the signal includes a reset signal to be supplied to the memory devices.

4. The semiconductor memory module of claim 1, wherein the signal includes a reset signal, and wherein the semiconductor memory module further comprises a driver mounted on the memory PCB and configured to receive the reset signal and to transfer the reset signal to the memory devices.

5. The semiconductor memory module of claim 4, further comprising:
data buffers connected between the first connectors and the memory devices.

6. The semiconductor memory module of claim 1, wherein the signal includes a power supply voltage supplied from the external device.

7. The semiconductor memory module of claim 1, further comprising:
a driver configured to receive the signal from the third connector, to receive the second voltage from the power management integrated circuit, to compare the signal and the second voltage to detect the difference, and to transfer a code indicating the difference to the power management integrated circuit.

8. The semiconductor memory module of claim 7, wherein the signal includes a reset signal, and
wherein the driver is further configured to transfer the reset signal to the memory devices.

9. The semiconductor memory module of claim 7, wherein the signal includes a power supply voltage supplied from the external device.

10. The semiconductor memory module of claim 1, wherein the power management integrated circuit is configured to adjust the second voltage in response to that a reset signal is activated and then is deactivated.

11. A semiconductor memory module comprising:
a memory printed circuit board (PCB) including first connectors and a second connector, the first and second connectors configured to be connectable with an external device;
memory devices mounted on the memory PCB and connected with the first connectors; and
a power management integrated circuit mounted on the memory PCB, and configured to receive a first voltage through the second connector, to generate a second voltage from the first voltage, and to supply the second voltage to the memory devices,
wherein the power management integrated circuit is further configured to adjust the second voltage depending on an amount of current flowing at an idle time.

12. The semiconductor memory module of claim 11, wherein the idle time includes a time when the memory devices are in a standby state and the semiconductor memory module is in a state where a communication with the external device is absent.

13. The semiconductor memory module of claim 11, wherein the power management integrated circuit is configured to detect the amount of current flowing at the idle time and is configured to adjust the second voltage when the amount of current is greater than a threshold.

14. The semiconductor memory module of claim 11, wherein the memory PCB further includes third connectors configured to be connectable with the external device,
wherein the semiconductor memory module further includes a driver configured to receive an address and a command through the third connectors and to transfer the address and the command to the memory devices, and
wherein the driver is further configured to detect the amount of current and to transmit a code requesting an adjustment of the second voltage to the power management integrated circuit when the amount of current is greater than a threshold.

15. The semiconductor memory module of claim 11, wherein at least one of the memory devices is further configured to detect the amount of current and to transmit a code requesting an adjustment of the second voltage to the power management integrated circuit when the amount of current is greater than a threshold.

16. The semiconductor memory module of claim 11, further comprising:
data buffers connected between the first connectors and the memory devices,
wherein at least one of the data buffers is further configured to detect the amount of current and to transmit a code requesting an adjustment of the second voltage to the power management integrated circuit when the amount of current is greater than a threshold.

17. The semiconductor memory module of claim 11, wherein
the semiconductor memory module is configured to terminate the first connectors and the second connector with the second voltage, based on a pseudo open drain (POD).

18. A semiconductor memory module comprising:
a memory printed circuit board (PCB) including first connectors, a second connector, and a third connector, the first, second, and third connectors configured to be connectable with an external device;
memory devices mounted on the memory PCB and connected to the first connectors; and
a power management integrated circuit mounted on the memory PCB, and configured to receive a first voltage through the second connector, to generate a second voltage from the first voltage, and to supply the second voltage to the memory devices,
wherein, in a first mode, the power management integrated circuit is further configured to adjust the second voltage depending on a difference between a level of the second voltage and a signal received through the third connector, and wherein, in a second mode, the power management integrated circuit is further configured to adjust the second voltage depending on an amount of current flowing at an idle time.

19. The semiconductor memory module of claim 18, wherein the memory PCB further includes fourth connectors configured to be connectable with the external device, and wherein the semiconductor memory module includes:

a driver configured to receive an address and a command through the fourth connectors and to transfer the address and the command to the memory devices; and data buffers connected between the memory devices and the first connectors, and configured to operate under control of the driver.

20. The semiconductor memory module of claim 19, wherein, in the first mode, the power management integrated circuit or the driver detects the difference between the level of the second voltage and the signal, and wherein, the second mode, the power management integrated circuit, the driver, at least one of the memory devices, or at least one of the data buffers detects the amount of current.

* * * * *